US012796505B2

(12) United States Patent
Tsao et al.

(10) Patent No.: US 12,796,505 B2
(45) Date of Patent: Nov. 10, 2026

(54) INTEGRATED CIRCUIT PACKAGES AND METHODS OF FORMING THE SAME

(71) Applicant: Taiwan Semiconductor Manufacturing Co., Ltd., Hsinchu (TW)

(72) Inventors: Chih-Chiang Tsao, Taoyuan City (TW); Chao-Wei Chiu, Hsinchu (TW); Hsin Liang Chen, New Taipei City (TW); Chia-Shen Cheng, Zhubei City (TW); Hsiu-Jen Lin, Zhubei City (TW); Ching-Hua Hsieh, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 532 days.

(21) Appl. No.: 18/366,255

(22) Filed: Aug. 7, 2023

(65) Prior Publication Data

US 2024/0387346 A1 Nov. 21, 2024

Related U.S. Application Data

(60) Provisional application No. 63/502,679, filed on May 17, 2023.

(51) Int. Cl.

*H10W 70/65* (2026.01)
*H10W 70/05* (2026.01)
(Continued)

(52) U.S. Cl.

CPC ......... *H10W 70/65* (2026.01); *H10W 70/098* (2026.01); *H10W 70/685* (2026.01); *H10W 90/00* (2026.01); *H10W 90/701* (2026.01); *H10W 72/0198* (2026.01); *H10W 74/15* (2026.01); *H10W 90/724* (2026.01); *H10W 90/734* (2026.01); *H10W 90/792* (2026.01)

(58) Field of Classification Search

CPC .. H10W 70/65; H10W 70/098; H10W 70/685
See application file for complete search history.

(56) References Cited

U.S. PATENT DOCUMENTS

| | | | |
|---|---|---|---|
| 8,993,380 | B2 | 3/2015 | Hou et al. |
| 9,281,254 | B2 | 3/2016 | Yu et al. |

(Continued)

FOREIGN PATENT DOCUMENTS

| | | | |
|---|---|---|---|
| DE | 102021109273 | A1 | 2/2022 |
| JP | H10135276 | A | 5/1998 |

(Continued)

*Primary Examiner* — Errol V Fernandes
(74) *Attorney, Agent, or Firm* — Slater Matsil, LLP

(57) ABSTRACT

Embodiments include a device. The device includes an interposer, a package substrate, and conductive connectors bonding the package substrate to the interposer. Each of the conductive connectors have convex sidewalls. A first subset of the conductive connectors are disposed in a center of the package substrate in a top-down view. A second subset of the conductive connectors are disposed in an edge/corner of the package substrate in the top-down view. Each of the second subset of the conductive connectors have a greater height than each of the first subset of the conductive connectors.

20 Claims, 30 Drawing Sheets

(51) Int. Cl.

| | |
|---|---|
| ***H10W 70/685*** | (2026.01) |
| ***H10W 90/00*** | (2026.01) |
| *H10W 72/00* | (2026.01) |
| *H10W 74/15* | (2026.01) |

(56) References Cited

U.S. PATENT DOCUMENTS

| | | | | |
|---|---|---|---|---|
| 9,299,649 | B2 | 3/2016 | Chiu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,461,018 | B1 | 10/2016 | Tsai et al. | |
| 9,496,189 | B2 | 11/2016 | Yu et al. | |
| 9,666,502 | B2 | 5/2017 | Chen et al. | |
| 9,735,131 | B2 | 8/2017 | Su et al. | |
| 10,529,690 | B2 | 1/2020 | Shih et al. | |
| 11,715,731 | B2 | 8/2023 | Lin et al. | |
| 11,990,443 | B2 | 5/2024 | Huang et al. | |
| 2010/0163602 | A1 | 7/2010 | Okamoto et al. | |
| 2011/0233771 | A1 | 9/2011 | Kwon et al. | |
| 2011/0278056 | A1 | 11/2011 | Takeuchi et al. | |
| 2015/0097286 | A1 | 4/2015 | Suen et al. | |
| 2017/0278816 | A1* | 9/2017 | Li ........................ | H10W 90/701 |
| 2020/0020603 | A1* | 1/2020 | Tsao ..................... | H10W 42/121 |
| 2022/0359427 | A1 | 11/2022 | Wu et al. | |
| 2023/0060360 | A1 | 3/2023 | Seo et al. | |
| 2023/0062146 | A1 | 3/2023 | Wu et al. | |
| 2023/0361015 | A1* | 11/2023 | Tsai ..................... | H10W 70/095 |

FOREIGN PATENT DOCUMENTS

| | | | |
|---|---|---|---|
| KR | 19980054916 | A | 9/1998 |
| KR | 20150124251 | A | 11/2015 |
| KR | 20180054419 | A | 5/2018 |
| TW | 202310305 | A | 3/2023 |
| TW | 202312395 | A | 3/2023 |

* cited by examiner

INTEGRATED CIRCUIT PACKAGES AND METHODS OF FORMING THE SAME

PRIORITY CLAIM AND CROSS-REFERENCE

This application claims the benefit of U.S. Provisional Application No. 63/502,679, filed on May 17, 2023, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
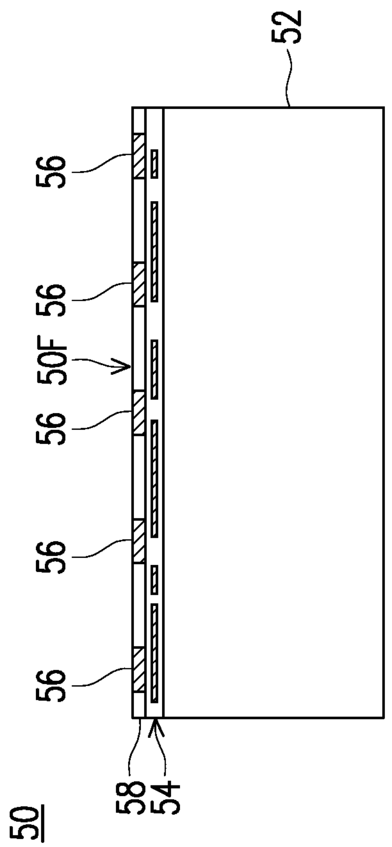
FIG. 1 is a cross-sectional view of an integrated circuit die.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, package substrates are bonded to an interposer wafer (e.g., a wafer including interposers) with conductive connectors having different heights. Specifically, the conductive connectors in regions where the package substrates have a large amount of warpage have a greater height than the conductive connectors in regions where the package substrates have a small amount of warpage. Forming the conductive connectors (e.g., solder connectors) with different heights may reduce the effects of warpage during the bonding of the package substrates to the interposer wafer. The quality of the conductive connectors may thus be improved, such as by reducing the risk of forming cold solder joints and/or reducing the risk of solder necking.

FIG. 1 is a cross-sectional view of an integrated circuit die 50. Multiple integrated circuit dies 50 will be packaged in subsequent processing to form integrated circuit packages. Each integrated circuit die 50 may be a logic die (e.g., central processing unit (CPU), graphics processing unit (GPU), system-on-a-chip (SoC) die, microcontroller, etc.), a memory die (e.g., dynamic random access memory (DRAM) die, static random access memory (SRAM) die, etc.), a power management die (e.g., power management integrated circuit (PMIC) die), a radio frequency (RF) die, an interface die, a sensor die, a micro-electro-mechanical-system (MEMS) die, a signal processing die (e.g., digital signal processing (DSP) die), a front-end die (e.g., analog front-end (AFE) dies), the like, or combinations thereof. The integrated circuit die 50 may be formed in a wafer, which may include different die regions that are singulated in subsequent steps to form a plurality of integrated circuit dies 50. The integrated circuit die 50 includes a semiconductor substrate 52, an interconnect structure 54, die connectors 56, and a dielectric layer 58.

The semiconductor substrate 52 may be a substrate of silicon, doped or undoped, or an active layer of a semiconductor-on-insulator (SOI) substrate. The semiconductor substrate 52 may include other semiconductor materials, such as germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The semiconductor substrate 52 has an active surface (e.g., the surface facing upward in FIG. 1) and an inactive surface (e.g., the surface facing downward in FIG. 1). Devices are at the active surface of the semiconductor substrate 52. The devices may be active devices (e.g., transistors, diodes, etc.), capacitors, resistors, etc. The inactive surface may be free from devices.

The interconnect structure 54 is over the active surface of the semiconductor substrate 52, and is used to electrically connect the devices of the semiconductor substrate 52 to form an integrated circuit. The interconnect structure 54 may include one or more dielectric layer(s) and respective metallization layer(s) in the dielectric layer(s). Acceptable dielectric materials for the dielectric layers include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer, such as polybenzoxazole (PBO), polyimide, a benzocyclobuten (BCB) based polymer, or the like. The metallization layer(s) may include conductive vias and/or conductive lines to interconnect the devices of the semiconductor substrate 52. The metallization layer(s) may be formed of a conductive material, such as a metal, such as copper, cobalt, aluminum, gold, combinations thereof, or the like. The metallization layer(s) of the interconnect structure 54 may be formed by a damascene process, such as a single damascene process, a dual damascene process, or the like.

Die connectors 56 are at the front side 50F of the integrated circuit die 50. The die connectors 56 may be conductive pillars, pads, or the like, to which external connections are made. The die connectors 56 are in and/or on the interconnect structure 54. For example, the die connectors 56 may be part of an upper metallization layer of the interconnect structure 54. The die connectors 56 can be formed of a metal, such as copper, aluminum, or the like, and can be formed by, for example, plating, or the like.

Optionally, solder regions (not separately illustrated) may be disposed on the die connectors 56 during formation of the integrated circuit die 50. The solder regions may be used to perform chip probe (CP) testing on the integrated circuit die 50. For example, the solder regions may be solder balls, solder bumps, or the like, which are used to attach a chip probe to the die connectors 56. Chip probe testing may be performed on the integrated circuit die 50 to ascertain whether the integrated circuit die 50 is a known good die (KGD). Thus, only integrated circuit dies 50, which are KGDs, undergo subsequent processing are packaged, and dies which fail the chip probe testing are not packaged. After testing, the solder regions may be removed.

A dielectric layer 58 is at the front side 50F of the integrated circuit die 50. The dielectric layer 58 is in and/or on the interconnect structure 54. For example, the dielectric layer 58 may be an upper dielectric layer of the interconnect structure 54. The dielectric layer 58 laterally encapsulates the die connectors 56. The dielectric layer 58 may be an oxide, a nitride, a carbide, a polymer, the like, or a combination thereof. The dielectric layer 58 may be formed, for example, by spin coating, lamination, chemical vapor deposition (CVD), or the like. Initially, the dielectric layer 58 may bury the die connectors 56, such that the top surface of the dielectric layer 58 is above the top surfaces of the die connectors 56. The die connectors 56 may be exposed through the dielectric layer 58. Exposing the die connectors 56 may remove any solder regions that may be present on the die connectors 56. A removal process can be applied to the various layers to remove excess materials over the die connectors 56. The removal process may be a planarization process such as a chemical mechanical polish (CMP), an etch-back, combinations thereof, or the like. After the planarization process, top surfaces of the die connectors 56 and the dielectric layer 58 are coplanar (within process variations) and are exposed at the front side 50F of the integrated circuit die 50.

Figure 2A:
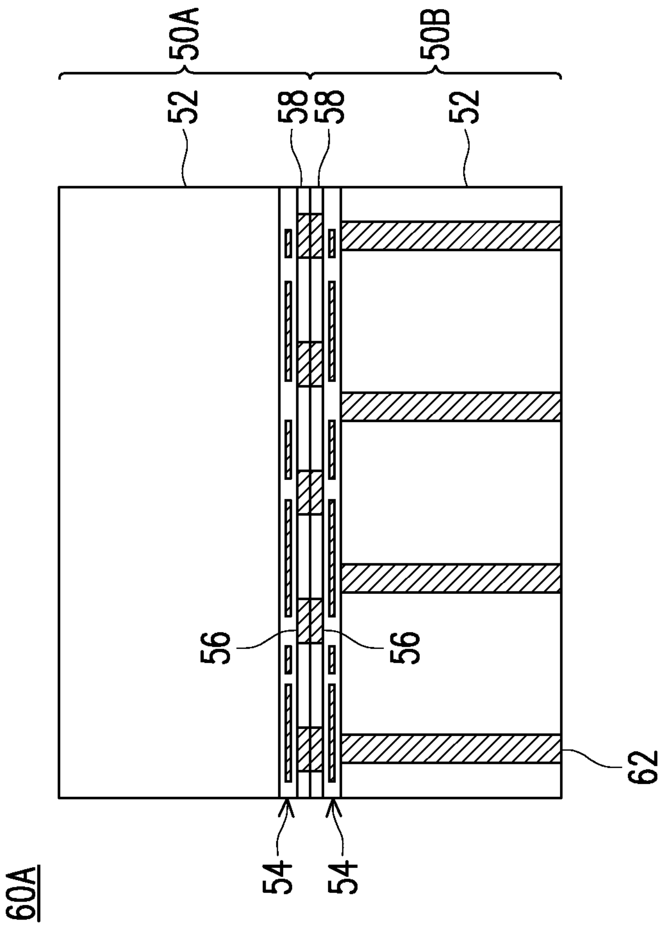
FIGS. 2A-2B are cross-sectional views of die stacks.
Figure 2B:
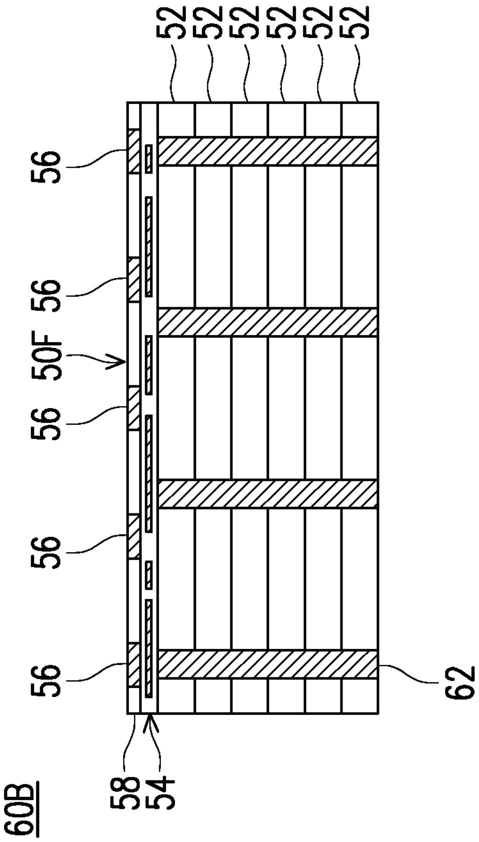

FIGS. 2A-2B are cross-sectional views of die stacks 60A, 60B, respectively. The die stacks 60A, 60B may each have a single function (e.g., a logic device, memory die, etc.), or may have multiple functions. In some embodiments, the die stack 60A is a logic device such as a system-on-integrated-chip (SoIC) device and the die stack 60B is a memory device such as high bandwidth memory (HBM) device.

As shown in FIG. 2A, the die stack 60A includes two bonded integrated circuit dies 50 (e.g., a first integrated circuit die 50A and a second integrated circuit die 50B). In some embodiments, the first integrated circuit die 50A is a logic die, and the second integrated circuit die 50B is an interface die. The interface die bridges the logic die to memory dies, and translates commands between the logic die and the memory dies. In some embodiments, the first integrated circuit die 50A and the second integrated circuit die 50B are bonded such that the active surfaces are facing each other (e.g., are "face-to-face" bonded). Conductive vias 62 may be formed through one of the integrated circuit dies 50 so that external connections may be made to the die stack 60A. The conductive vias 62 may be through-substrate vias (TSVs), such as through-silicon vias or the like. In the illustrated embodiment, the conductive vias 62 are formed in the second integrated circuit die 50B (e.g., the interface die). The conductive vias 62 extend through the semiconductor substrate 52 of the respective integrated circuit die 50, to be physically and electrically connected to the metallization layer(s) of the interconnect structure 54.

As shown in FIG. 2B, the die stack 60B is a stacked device that includes multiple semiconductor substrates 52. For example, the die stack 60B may be a memory device that includes multiple memory dies such as a hybrid memory cube (HMC) device, a high bandwidth memory (HBM) device, or the like. Each of the semiconductor substrates 52 may (or may not) have a separate interconnect structure 54. The semiconductor substrates 52 are connected by conductive vias 62, such as TSVs.

FIGS. 3-14 are views of intermediate stages in the manufacturing of integrated circuit packages 200, in accordance with some embodiments. Multiple package regions 100P are illustrated, and an integrated circuit package 200 is formed in each of the package regions 100P. An interposer wafer 100 is formed. The interposer wafer 100 includes an interposer in each package region 100P. Integrated circuit devices 202 are bonded to the interposer wafer 100. The interposer in each package region 100P may include an interconnection die 120 for interconnecting the integrated circuit devices 202 in the respective package region 100P. Package substrates 220 are then mounted to the interposer wafer 100. Specifically, a package substrate 220 is attached in each package region 100P. The package regions 100P are then singulated to form the integrated circuit packages 200, which each include a singulated portion of the interposer wafer 100 (e.g., an interposer) and a package substrate 220. In an embodiment, the integrated circuit packages 200 are chip-on-wafer-on-substrate (CoWoS®) packages, such as CoWoS-L packages, although it should be appreciated that embodiments may be applied to other 3DIC packages.

Figure 3:
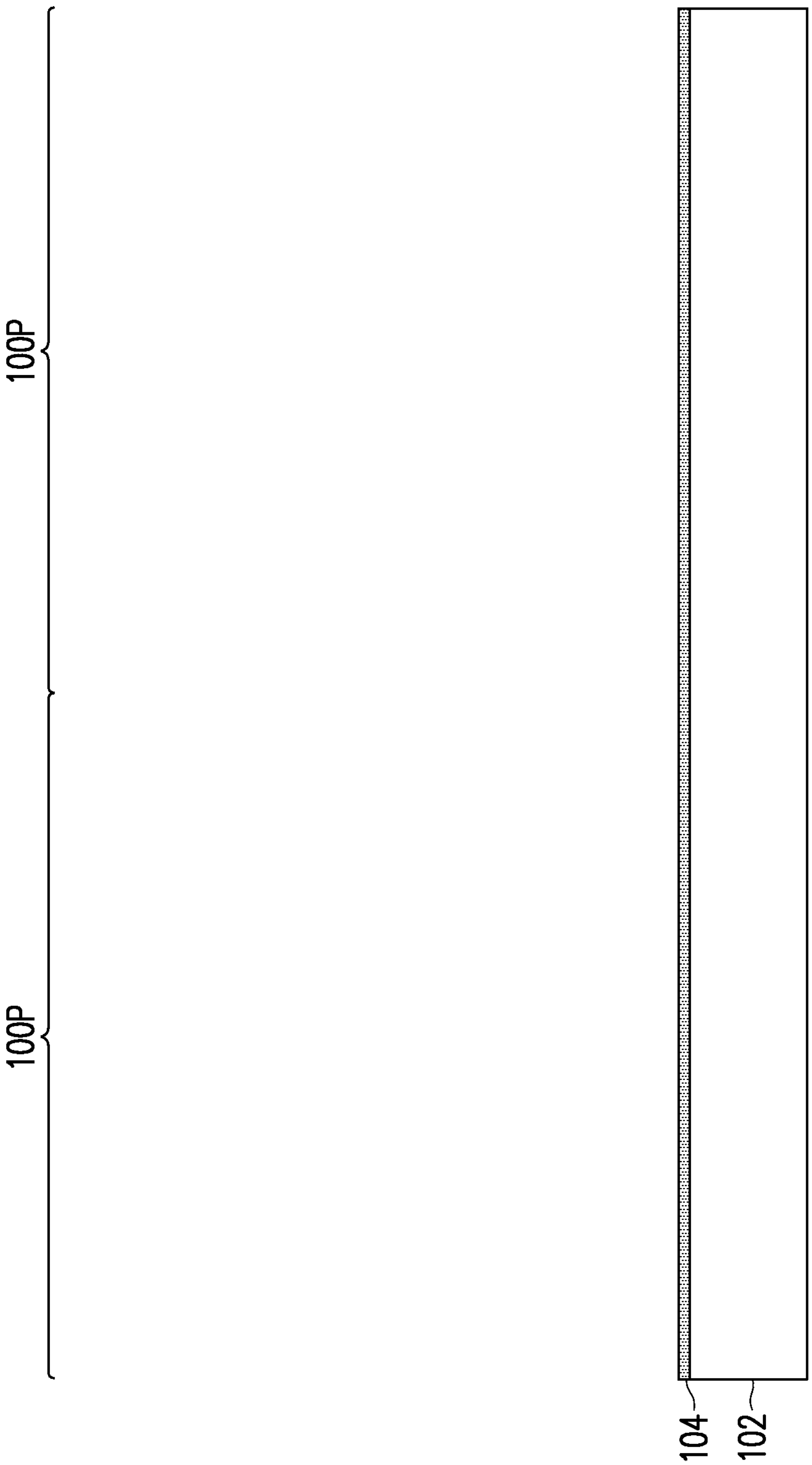
FIGS. 3-14 are views of intermediate stages in the manufacturing of integrated circuit packages, in accordance with some embodiments.

In FIG. 3, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously.

The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

Figure 4:
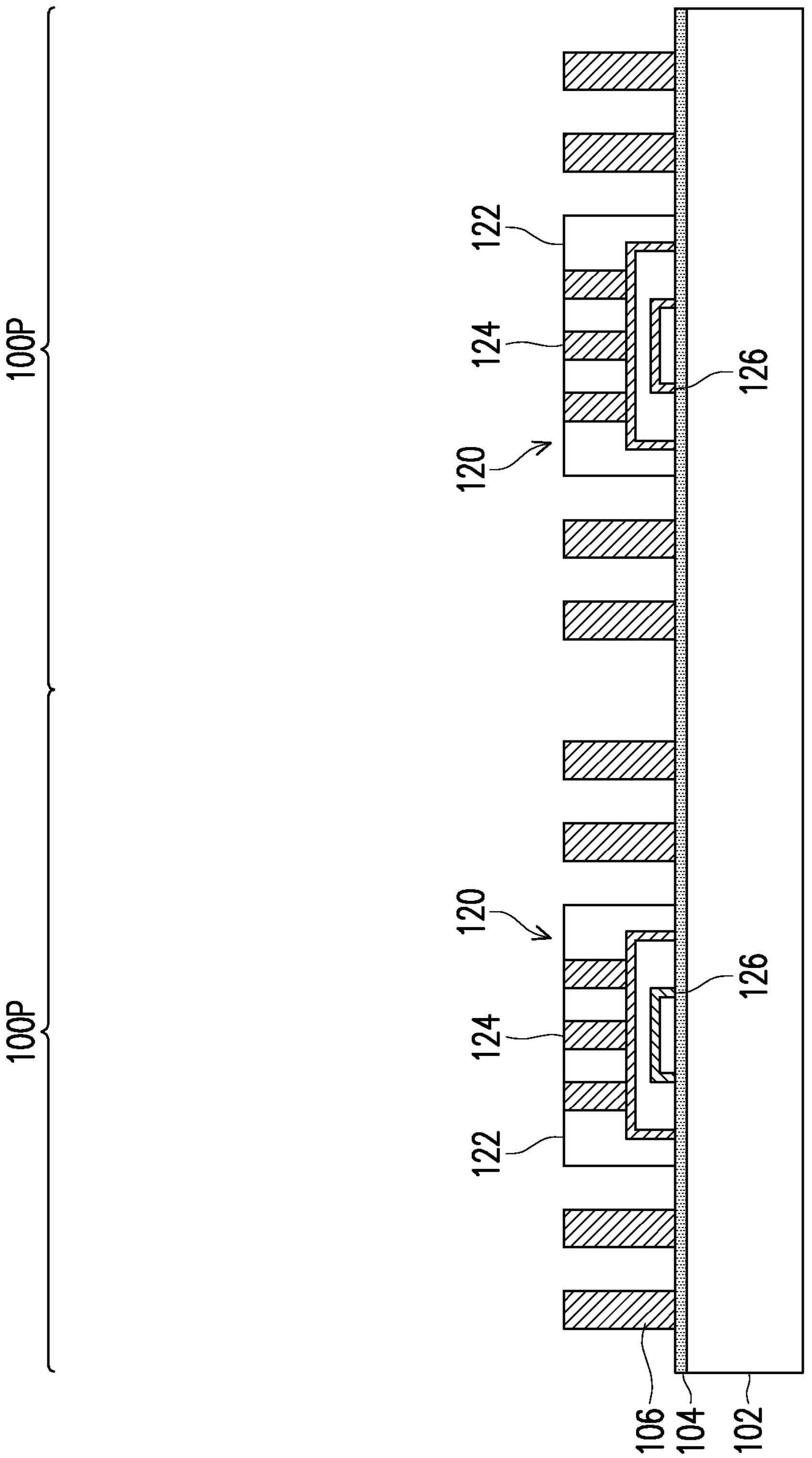

In FIG. 4, through vias 106 are formed over the carrier substrate 102 (e.g., on the release layer 104). As an example to form the through vias 106, a seed layer (not shown) is formed over the release layer 104. In some embodiments, the seed layer is a metal layer, which may be a single layer or a composite layer comprising a plurality of sub-layers formed of different materials. In an embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to the through vias 106. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by an acceptable etching process, such as by wet or dry etching. The remaining portions of the seed layer and conductive material form the through vias 106.

Interconnection dies 120 are attached to the carrier substrate 102. Each interconnection die 120 may be a local silicon interconnect (LSI), a large scale integration package, an interposer die, or the like. In the illustrated embodiment, one interconnection die 120 is attached in each package region 100P. It should be appreciated that any desired quantity of interconnection dies 120 may be placed in the package regions 100P. The interconnection dies 120 may be placed by, e.g., a pick-and-place process. Each interconnection die 120 includes a substrate 122, with conductive features formed in and/or on the substrate 122. The substrates 122 may include a semiconductor substrate, one or more dielectric layer(s), or the like. Additionally, each interconnection die 120 may include through-substrate vias (TSVs) 124 that extend into or through the substrate 122, and may be coupled to the conductive features of the interconnection die 120. In the illustrated embodiment, the TSVs 124 are exposed at the back sides of the interconnection dies 120. In another embodiment, the substrates 122 may cover the TSVs 124 at the back sides of the interconnection dies 120.

In embodiments where the interconnection dies 120 are LSIs, the interconnection dies 120 may be bridge structures that include die bridges 126. The die bridges 126 may be metallization layers formed in and/or on, e.g., the substrate 122, and work to interconnect integrated circuit devices (subsequently described) to one another. As such, the LSI can be used to directly connect and allow communication between the integrated circuit devices. In such embodiments, the interconnection dies 120 can be placed in a region that is disposed between the subsequently bonded integrated circuit devices so that each of the interconnection dies 120 overlaps the overlying integrated circuit devices. In some embodiments, the interconnection dies 120 may further include logic devices and/or memory devices. The interconnection dies 120 are attached to the carrier substrate 102 such that the die bridges 126 face the carrier substrate 102.

Figure 5:
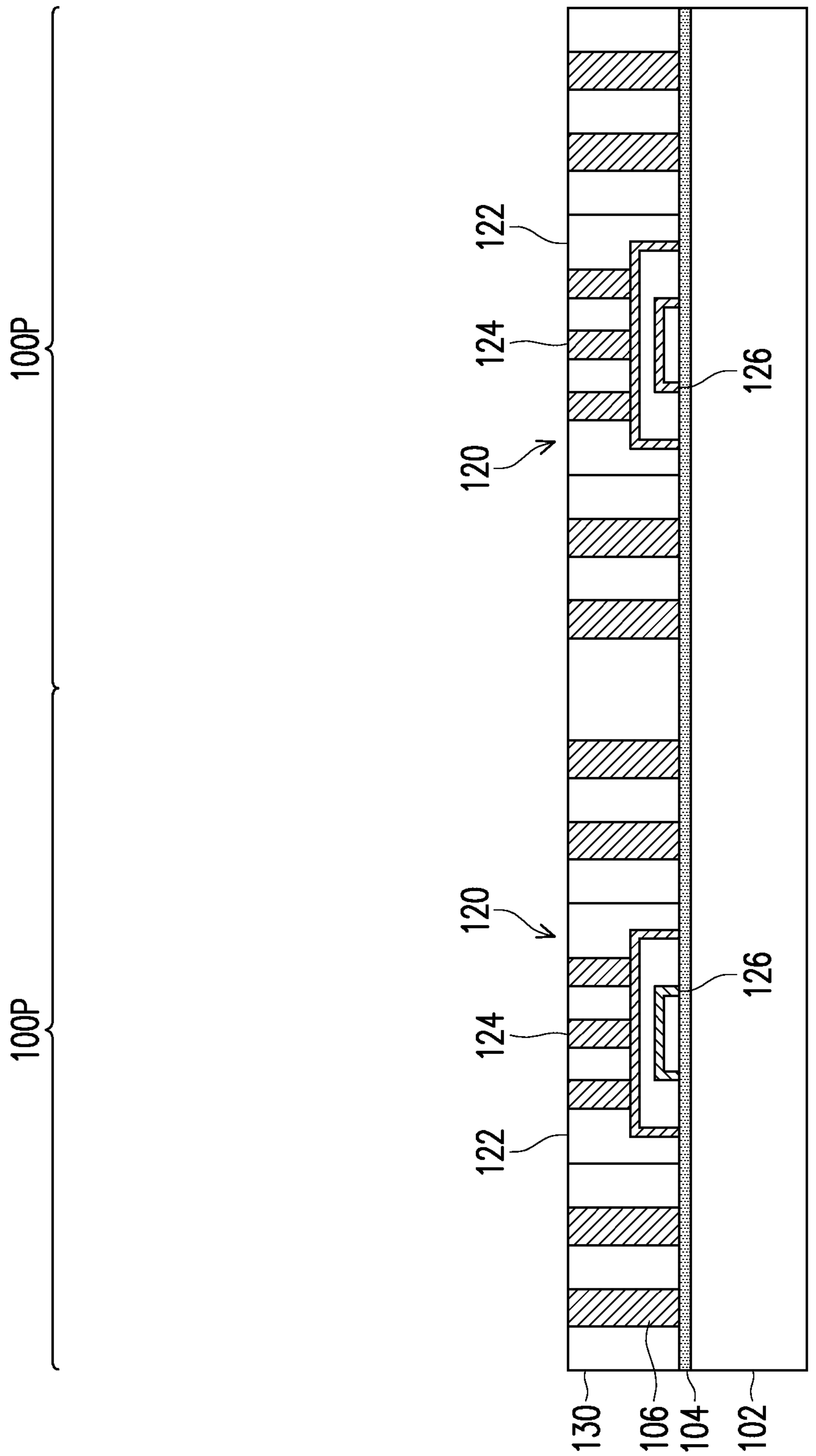

In FIG. 5, an encapsulant 130 is formed on and around the various components. After formation, the encapsulant 130 encapsulates the through vias 106 and the interconnection dies 120. The encapsulant 130 may be a molding compound, epoxy, or the like. The encapsulant 130 may be applied by compression molding, transfer molding, or the like, and may be formed over the carrier substrate 102 such that the through vias 106 and/or the interconnection dies 120 are buried or covered. The encapsulant 130 is further formed in gap regions between the interconnection dies 120 and the through vias 106. The encapsulant 130 may be applied in liquid or semi-liquid form and then subsequently cured.

A planarization process may optionally be performed on the encapsulant 130 to expose the through vias 106 and the TSVs 124. The planarization process may also remove material of the through vias 106, the substrates 122, and/or the TSVs 124 until the TSVs 124 and the through vias 106 are exposed. The top surfaces of the through vias 106, the substrates 122, the TSVs 124, and the encapsulant 130 are substantially coplanar (within process variations) after the planarization process. The planarization process may be, for example, a chemical-mechanical polish (CMP), a grinding process, or the like. In some embodiments, the planarization may be omitted, for example, if the through vias 106 and/or the TSVs 124 are already exposed.

Figure 6:
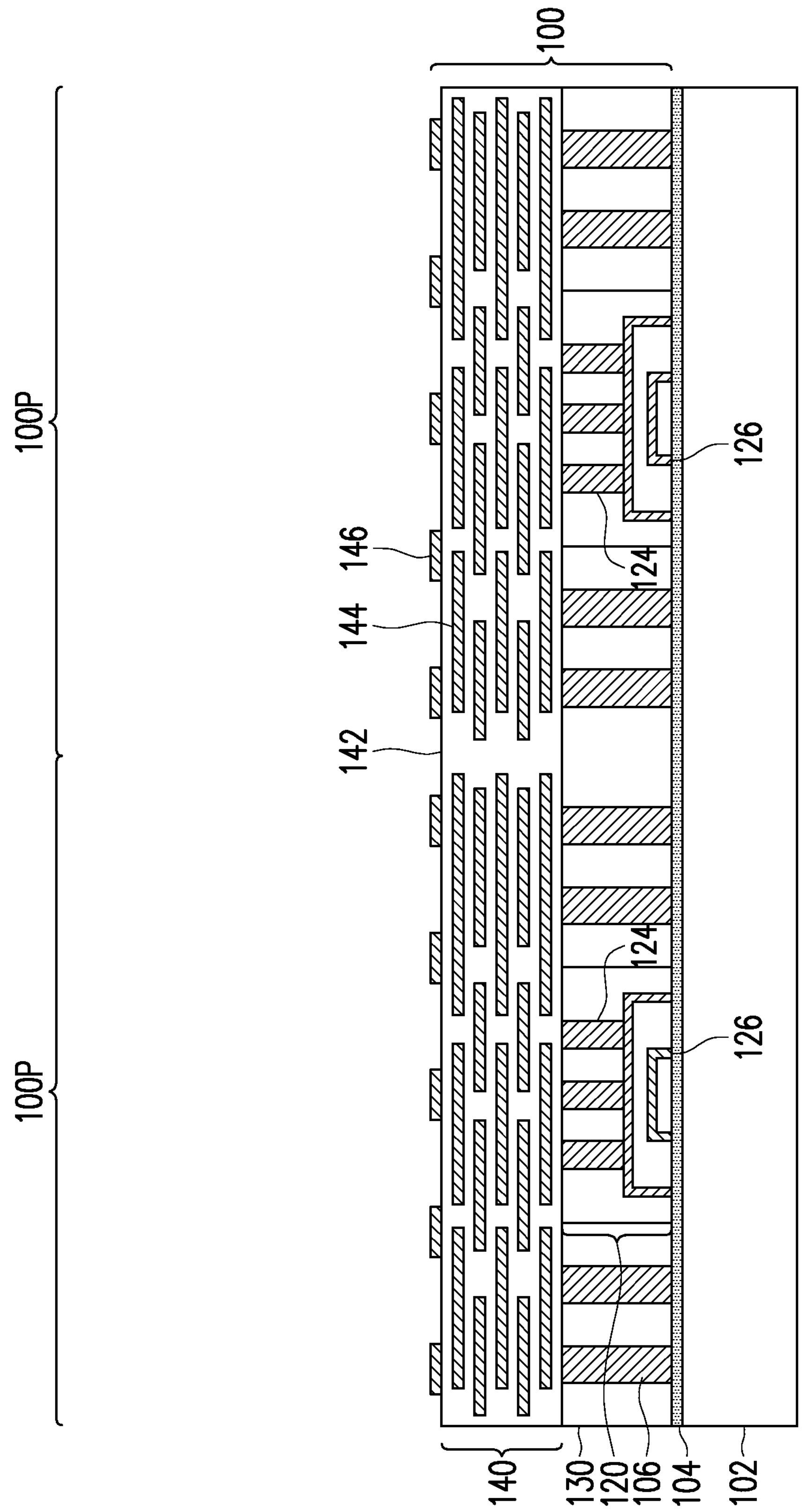

In FIG. 6, a front-side redistribution structure 140 is formed on the top surfaces of the encapsulant 130, the through vias 106, and the interconnection dies 120 (e.g., the substrates 122). The front-side redistribution structure 140 includes dielectric layers 142 and metallization layers 144 (sometimes referred to as redistribution layers or redistribution lines) among the dielectric layers 142. Thus, the front-side redistribution structure 140 includes a plurality of metallization layers 144 separated from each other by respective dielectric layers 142. The metallization layers 144 of the front-side redistribution structure 140 are connected to the through vias 106 and the interconnection dies 120 (e.g., the TSVs 124).

In some embodiments, the dielectric layers 142 are formed of a polymer, which may be a photosensitive material such as PBO, polyimide, a BCB-based polymer, or the like, that may be patterned using a lithography mask. In other embodiments, the dielectric layers 142 are formed of a nitride such as silicon nitride; an oxide such as silicon oxide, PSG, BSG, BPSG; or the like. The dielectric layers 142 may be formed by spin coating, lamination, CVD, the like, or a combination thereof. After each dielectric layer 142 is formed, it is then patterned to expose underlying conductive features, such as portions of the underlying through vias 106, the TSVs 124, and/or the metallization layers 144. The patterning may be by an acceptable process, such as by exposing the dielectrics layers to light when the dielectric layers 142 are a photosensitive material, or by etching using, for example, an anisotropic etch. If the dielectric layers 142 are photosensitive materials, the dielectric layers 142 can be developed after the exposure.

The metallization layers 144 each include conductive vias and/or conductive lines. The conductive vias extend through respective dielectric layers 142, and the conductive lines extend along respective dielectric layers 142. As an example to form a metallization layer 144, a seed layer (not illustrated) is formed over the respective underlying features. For example, the seed layer can be formed on a respective dielectric layer 142 and in the openings through the respective dielectric layer 142. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using a deposition process, such as PVD or the like. A photoresist is then formed and patterned on the seed layer. The photoresist may be formed by spin coating or the like and may be exposed to light for patterning. The pattern of the photoresist corresponds to the metallization layer 144. The patterning forms openings through the photoresist to expose the seed layer. A conductive material is formed in the openings of the photoresist and on the exposed portions of the seed layer. The conductive material may be formed by plating, such as electroless plating or electroplating from the seed layer, or the like. The conductive material may comprise a metal or a metal alloy, such as copper, titanium, tungsten, aluminum, the like, or combinations thereof. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by an acceptable etching process, such as by wet or dry etching. The remaining portions of the seed layer and conductive material form the metallization layer 144 for one level of the front-side redistribution structure 140.

The front-side redistribution structure 140 is illustrated as an example. More or fewer dielectric layers 142 and metallization layers 144 than illustrated may be formed by repeating or omitting the steps previously described.

Under-bump metallizations (UBMs) 146 are formed for external connection to the front-side redistribution structure 140. The UBMs 146 have bump portions on and extending along the major surface of the upper dielectric layer 142 of the front-side redistribution structure 140, and have via portions extending through the upper dielectric layer 142 of the front-side redistribution structure 140 to physically and electrically couple the upper metallization layer 144 of the front-side redistribution structure 140. As a result, the UBMs 146 are electrically connected to the through vias 106 and the interconnection dies 120 (e.g., the TSVs 124). The UBMs 146 may be formed of the same material as the metallization layers 144, and may be formed by a similar process as the metallization layers 144. In some embodiments, the UBMs 146 have a different size than the metallization layers 144.

Figure 7:
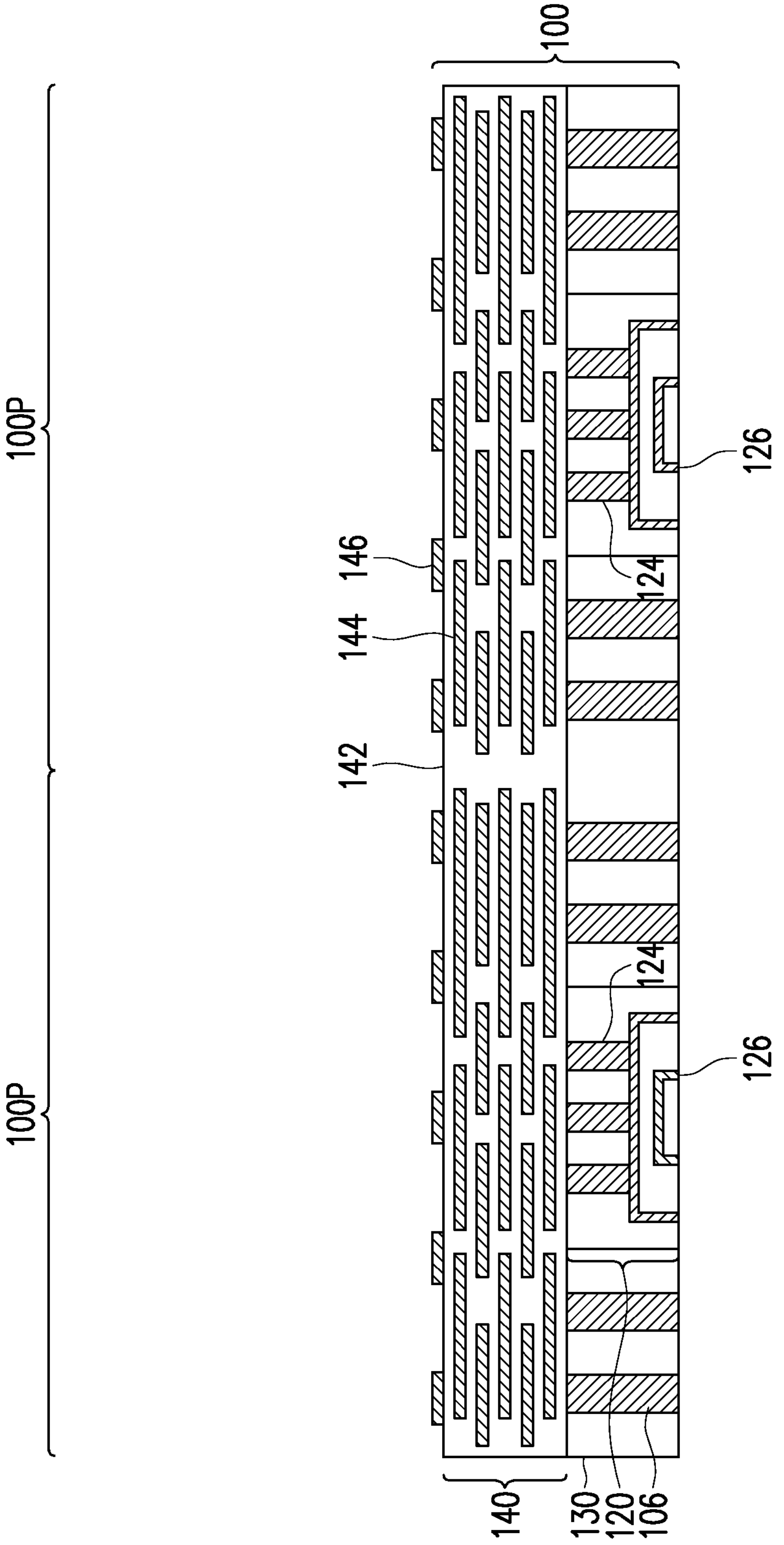

In FIG. 7, a carrier substrate de-bonding is performed to detach (or "de-bond") the carrier substrate 102 from the interposer wafer 100. In accordance with some embodiments, the de-bonding includes projecting a light such as a laser light or an UV light on the release layer 104 so that the release layer 104 decomposes under the heat of the light and the carrier substrate 102 can be removed.

Figure 8:
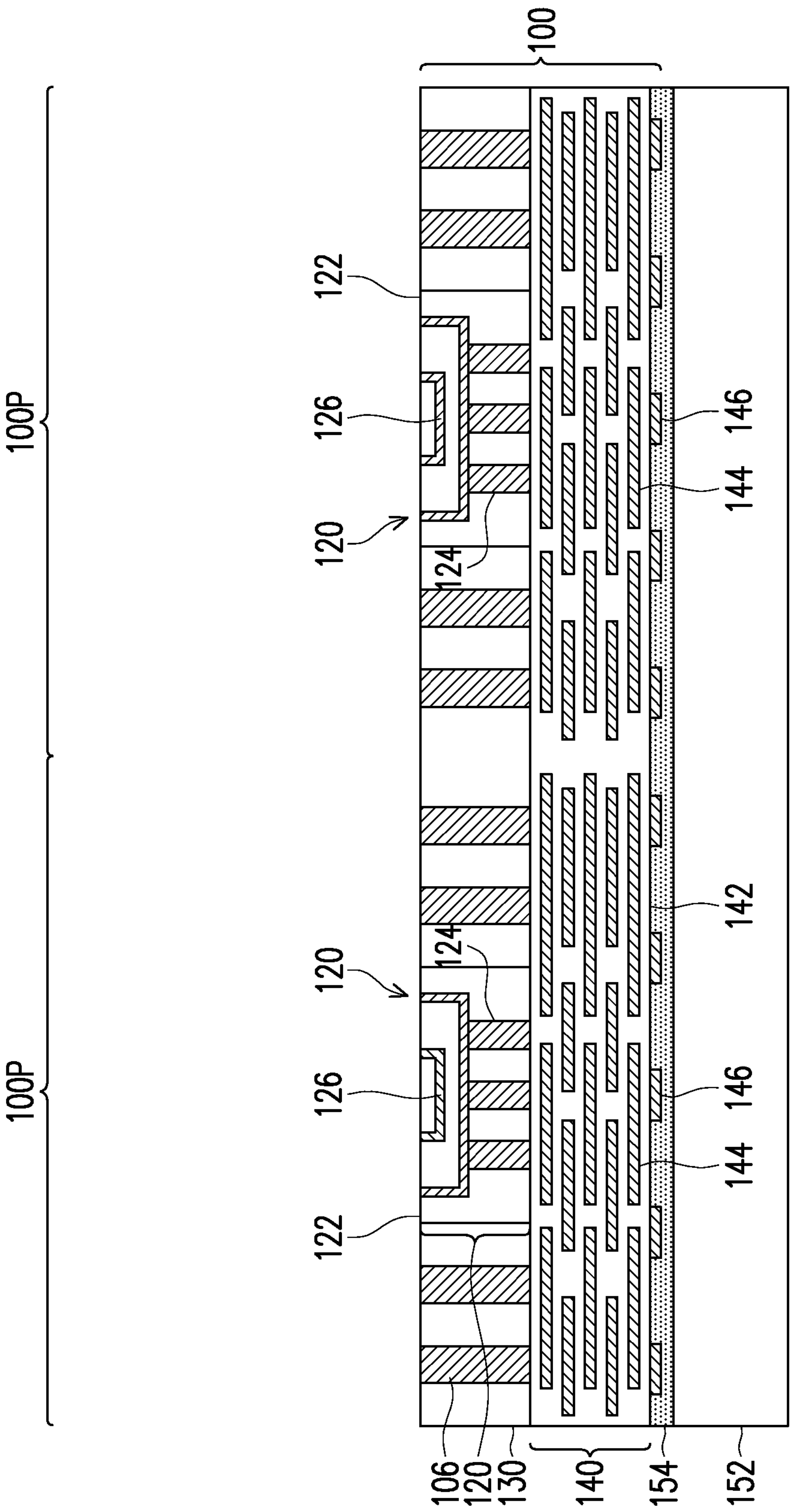

In FIG. 8, the interposer wafer 100 is flipped over to prepare for processing of the back side of the interposer wafer 100. The interposer wafer 100 may be placed on a carrier substrate 152 or other suitable support structure for subsequent processing. In some embodiments, the carrier substrate 152 is a substrate such as a bulk semiconductor or a glass substrate. The carrier substrate 152 is attached to the front side of the interposer wafer 100. The carrier substrate 152 may be attached by a bonding layer (not separately illustrated), which may be removed along with the carrier substrate 152 from the structure after processing. In some embodiments, the bonding layer includes an oxide layer such as a layer of silicon oxide. In some embodiments, the bonding layer includes an adhesive, such as a suitable epoxy or the like.

In some embodiments, a buffer layer 154 is formed between the carrier substrate 152 and the front-side redistribution structure 140. The buffer layer 154 may be formed of an insulating material such as silicon oxide, silicon nitride, a molding compound, epoxy, or the like. The buffer layer 154 covers and protects the UBMs 146. A planarization process may optionally be performed on the buffer layer 154, thereby forming a planar surface to which the carrier substrate 152 may be bonded. The planarization process may be, for example, a chemical-mechanical polish (CMP), a grinding process, or the like.

Figure 9:
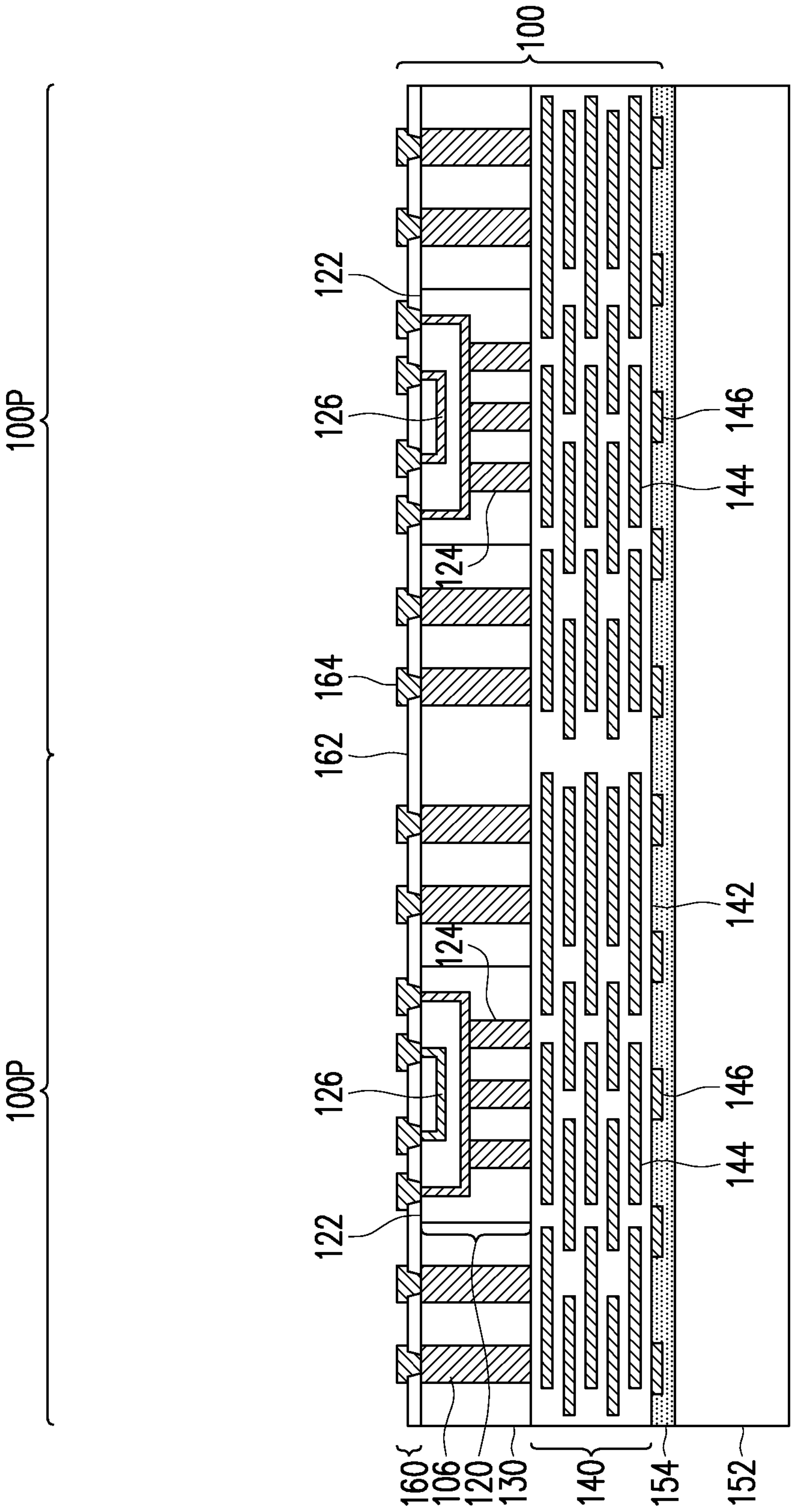

In FIG. 9, a back-side redistribution structure 160 is formed on the bottom surfaces of the encapsulant 130, the through vias 106, and the interconnection dies 120 (e.g., the substrates 122). The back-side redistribution structure 160 includes dielectric layers 162 and metallization layers 164, in a similar manner as the front-side redistribution structure 140. The back-side redistribution structure 160 may be formed by a similar process as the front-side redistribution structure 140.

The metallization layers 164 are connected to the through vias 106 and to the interconnection dies 120 (e.g., the die bridges 126). Additionally, the metallization layers 164 may include die connectors, to which integrated circuit devices will be bonded. The back-side redistribution structure 160 is illustrated as an example. More or fewer dielectric layers 162 and metallization layers 164 than illustrated may be formed in the back-side redistribution structure 160.

Figure 10:
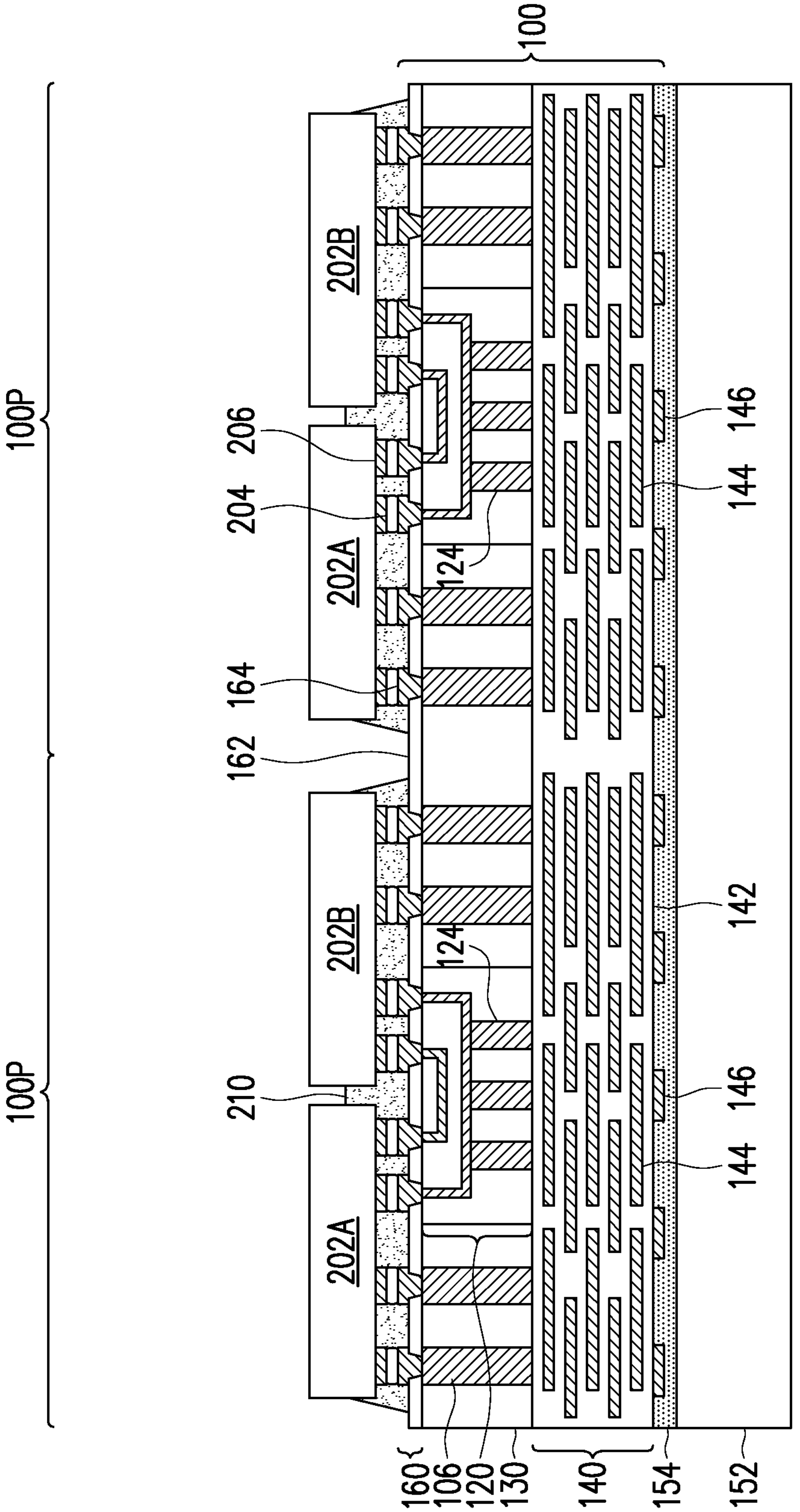

In FIG. 10, integrated circuit devices 202 are bonded to the back side of the interposer wafer 100 (e.g., to the back-side redistribution structure 160). Multiple integrated circuit devices 202 are placed adjacent one another in each package region 100P. The integrated circuit devices 202 in each package region 100P may include a logic device 202A and a memory device 202B. The logic devices 202A and the memory devices 202B may be formed in processes of a same technology node, or may be formed in processes of different technology nodes. For example, the logic devices 202A may be formed by a more advanced process node than the memory devices 202B.

Each logic device 202A may be a central processing unit (CPU), graphics processing unit (GPU), system-on-a-chip (SoC), microcontroller, or the like. The logic devices 202A may be integrated circuit dies (similar to the integrated circuit die 50 described for FIG. 1) or may be die stacks (similar to the die stack 60A described for FIG. 2A). In some embodiments, the logic devices 202A are integrated circuit dies such as system-on-a-chip (SoC) dies. In some embodiments, the logic devices 202A are die stacks such as system-on-integrated-chip (SoIC) devices.

Each memory device 202B may be a dynamic random access memory (DRAM) die, static random access memory (SRAM) die, hybrid memory cube (HMC) module, a high bandwidth memory (HBM) module, or the like. The memory devices 202B may be integrated circuit dies (similar to the integrated circuit die 50 described for FIG. 1) or may be die stacks (similar to the die stack 60B described for FIG. 2B). In some embodiments, the memory devices 202B are die stacks, such as high bandwidth memory (HBM) devices.

In the illustrated embodiment, the integrated circuit devices 202 are bonded to the interposer wafer 100 with solder bonds, such as with conductive connectors 204. The integrated circuit devices 202 may be placed on the back-side redistribution structure 160 using, e.g., a pick-and-place tool. The conductive connectors 204 may be formed of a conductive material that is reflowable, such as solder, copper, aluminum, gold, nickel, silver, palladium, tin, the like, or a combination thereof. In some embodiments, the conductive connectors 204 are formed by initially forming a layer of solder through methods such as evaporation, electroplating, printing, solder transfer, ball placement, or the like. Once a layer of solder has been formed on the structure, a reflow may be performed in order to shape the conductive connectors 204 into desired bump shapes. Bonding the integrated circuit devices 202 to the interposer wafer 100 may include placing the integrated circuit devices 202 on the interposer wafer 100 and reflowing the conductive connectors 204. Die connectors 206 are at the front sides of the integrated circuit devices 202. The conductive connectors 204 form joints between the die connectors 206 of the integrated circuit devices 202 and the die connectors of the back-side redistribution structure 160, thereby electrically connecting the interposers of the interpose wafer 100 to the integrated circuit devices 202.

An underfill 210 may be formed around the conductive connectors 204, and between the interposer wafer 100 and the integrated circuit devices 202. The underfill 210 may reduce stress and protect the joints resulting from the reflowing of the conductive connectors 204. The underfill 210 may be formed of an underfill material such as a molding compound, epoxy, or the like. The underfill 210 may be formed by a capillary flow process after the integrated circuit devices 202 are bonded to the interposer wafer 100, or may be formed by a suitable deposition method before the integrated circuit devices 202 are bonded to the interposer wafer 100. The underfill 210 may be applied in liquid or semi-liquid form and then subsequently cured.

Figure 11:
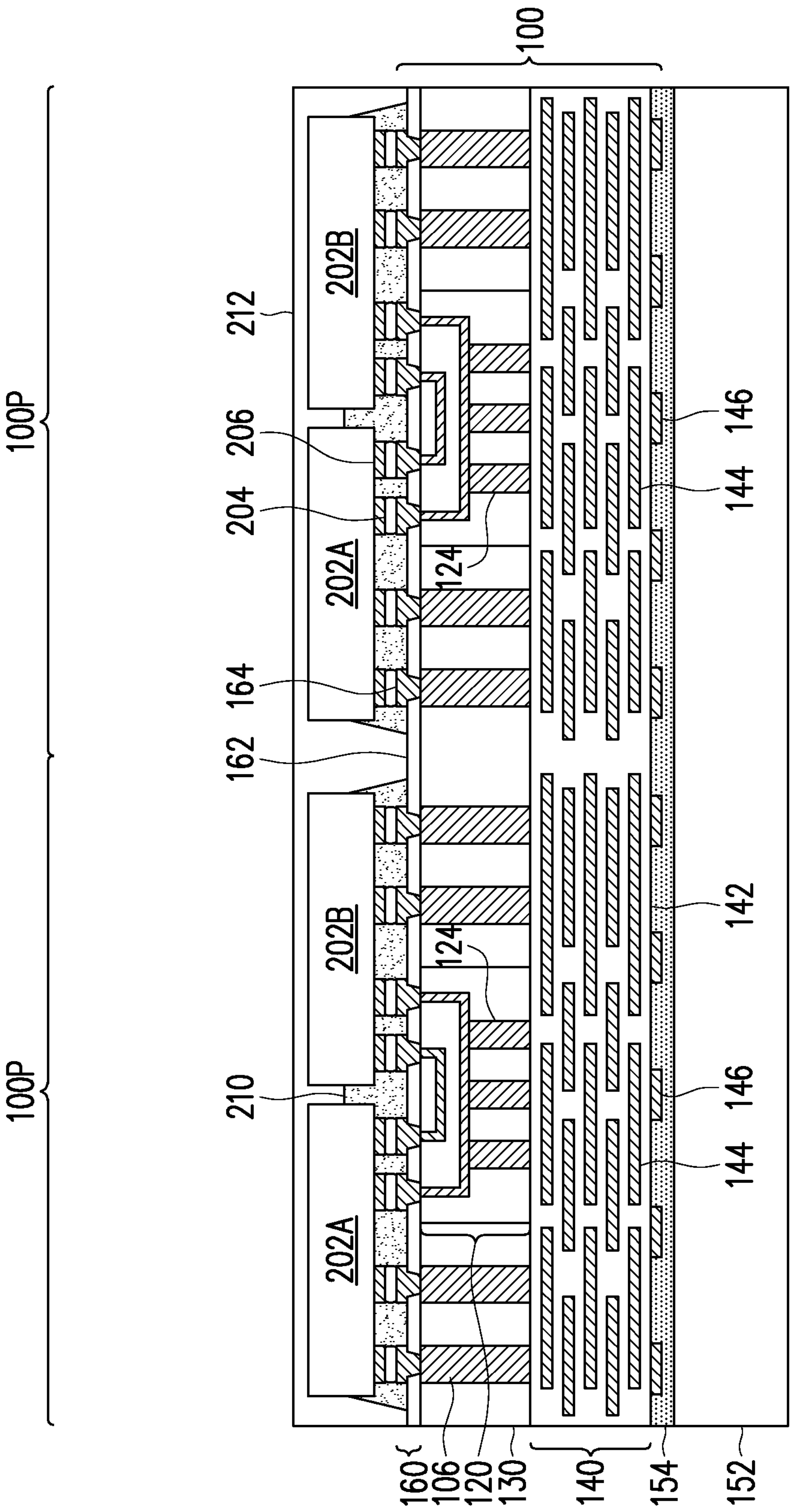

In FIG. 11, an encapsulant 212 is formed on and around the various components. After formation, the encapsulant 212 encapsulates the underfill 210 (if present) and the integrated circuit devices 202. The encapsulant 212 may be a molding compound, epoxy, or the like. The encapsulant 212 may be applied by compression molding, transfer molding, or the like, and is formed over the interposer wafer 100 such that the integrated circuit devices 202 are buried or covered. The encapsulant 212 is further formed in gap regions between the underfill 210 (if present) and/or the integrated circuit devices 202. The encapsulant 212 may be applied in liquid or semi-liquid form and then subsequently cured.

Optionally, the encapsulant 212 may be thinned (not separately illustrated) to expose the integrated circuit devices 202. The thinning process may be a grinding process, a chemical-mechanical polish (CMP), an etch-back, combinations thereof, or the like. After the thinning process, the top surfaces of the integrated circuit devices 202 and the encapsulant 212 are substantially coplanar (within process variations). The thinning is performed until a desired amount of the integrated circuit devices 202 and the encapsulant 212 has been removed.

Figure 12:
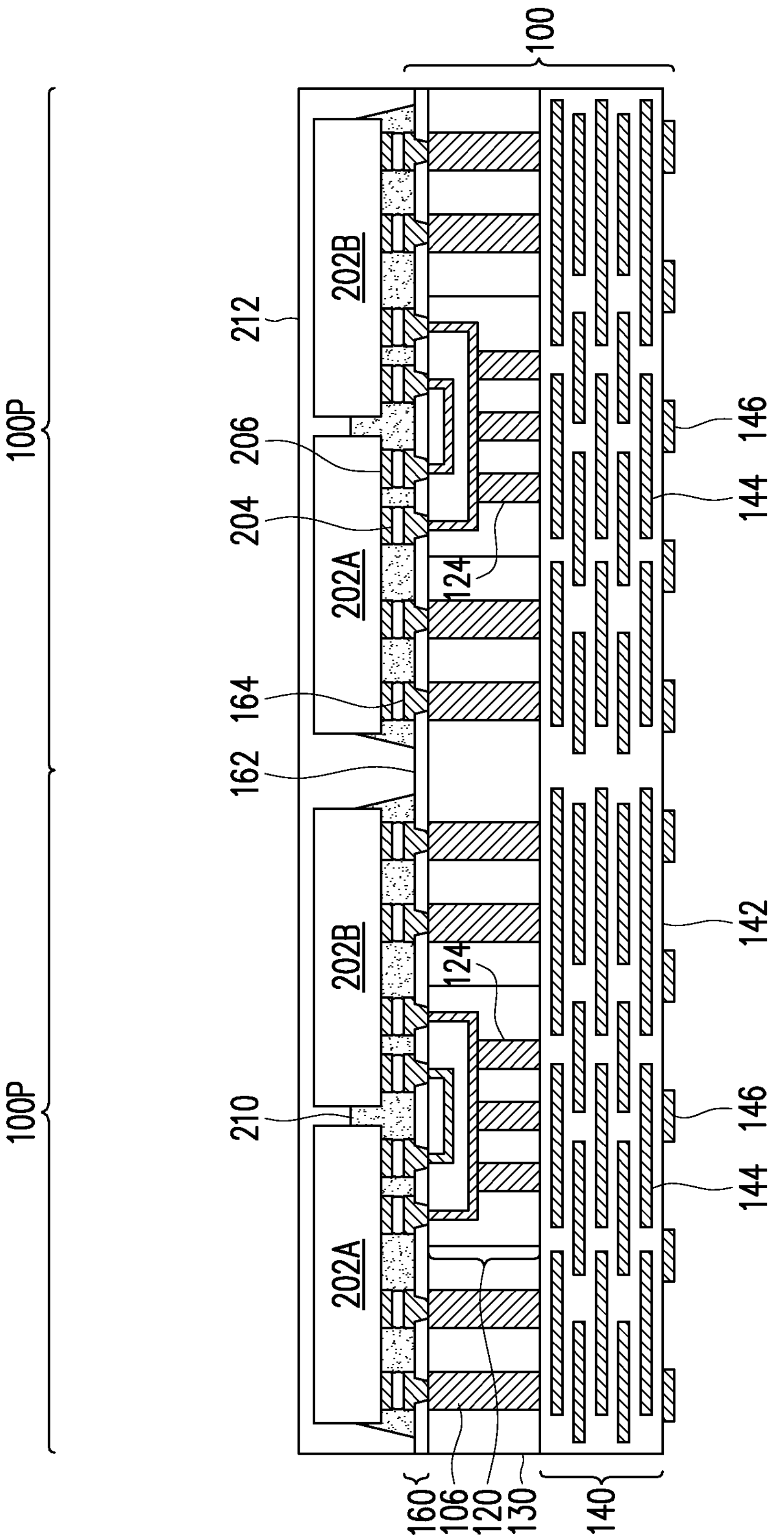

In FIG. 12, a carrier removal is performed to remove the carrier substrate 152 from the front-side redistribution structure 140. In embodiments where the carrier substrate 152 is attached to the front-side redistribution structure 140 by a bonding layer such as an oxide layer or an adhesive, the removal process may include a grinding process applied to the carrier substrate 152 and the bonding layer. The structure is then flipped over and placed on a tape (not separately illustrated). The tape may be supported by a suitable frame. The buffer layer 154, when present, is also removed to expose the UBMs 146. The buffer layer 154 may be removed by a suitable etching process or the like.

Figure 13:
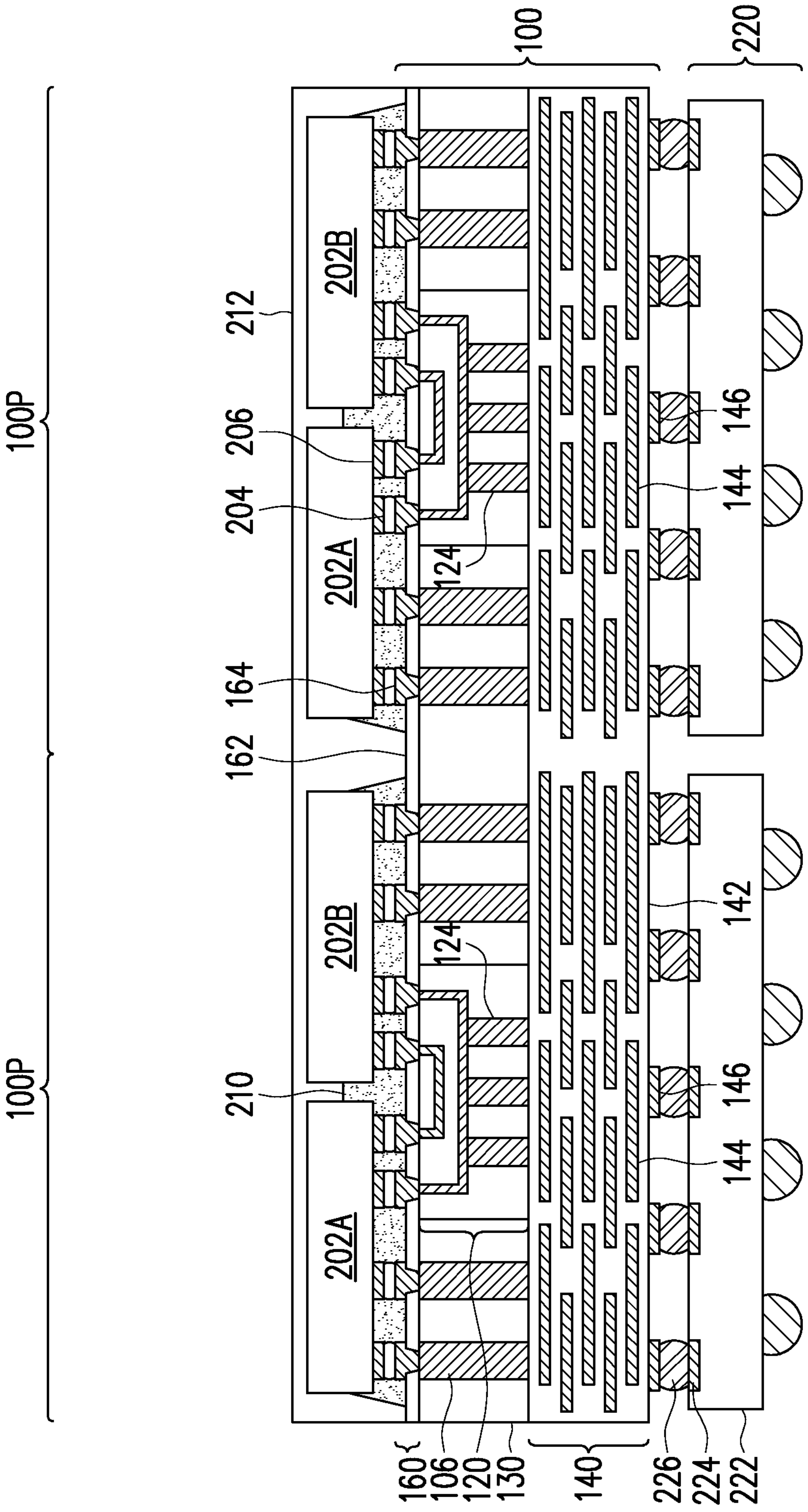

In FIG. 13, a plurality of package substrates 220 are bonded to the interposer wafer 100. Each package substrate 220 is bonded to a corresponding interposer in a corresponding package region 100P. Each package substrate 220 includes a substrate core 222, which may be formed of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations thereof, or the like, may also be used. Additionally, the substrate core 222 may be a SOI substrate. Generally, an SOI substrate includes a layer of a semiconductor material such as epitaxial silicon, germanium, silicon germanium, SOI, SGOI, or combinations thereof. The substrate core 222 is, in one alternative embodiment, an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for the substrate core 222.

The substrate core 222 may include active and passive devices (not separately illustrated). Devices such as transistors, capacitors, resistors, combinations thereof, and the like may be used to generate the structural and functional requirements of the design for the system. The devices may be formed using any suitable methods. In some embodiments, the substrate core 222 is substantially free of active and passive devices.

The substrate core 222 may also include metallization layers and vias (not separately illustrated). Each package substrate 220 further includes bond pads 224 over the metallization layers and vias of the substrate core 222. The metallization layers may be formed over the active and passive devices and are designed to connect the various devices to form functional circuitry. The metallization layers may be formed of alternating layers of dielectric material (e.g., low-k dielectric material) and conductive material (e.g., copper), with vias interconnecting the layers of conductive material, and may be formed through any suitable process (such as deposition, damascene, or the like). In some embodiments, the substrate core 222 has up to six dielectric layers and metallization layers.

The package substrates 220 may be bonded to the interposer wafer 100 using conductive connectors 226. The formation of the conductive connectors 226 will be subsequently described in greater detail for FIGS. 15-19. The conductive connectors 226 connect the interposer wafer 100, including metallization layers of the front-side redistribution structure 140, to the package substrates 220, including metallization layers of the substrate cores 222. Thus, the package substrates 220 are electrically connected to the integrated circuit devices 202 in the corresponding package regions 100P. In some embodiments, passive devices (e.g., surface mount devices (SMDs), not separately illustrated in FIG. 13, but see FIGS. 15-19) are bonded to the interposer wafer 100, such as to the same surface of the interposer wafer 100 as the conductive connectors 226.

In some embodiments, an underfill (not separately illustrated) is formed between the interposer wafer 100 and the package substrates 220, surrounding the conductive connectors 226 and the UBMs 146. The underfill may be formed by a capillary flow process after the package substrates 220 are bonded or may be formed by a suitable deposition method before the package substrates 220 are bonded. The underfill may be a continuous material extending from the front-side redistribution structure 140 to each of the package substrates 220.

Figure 14:
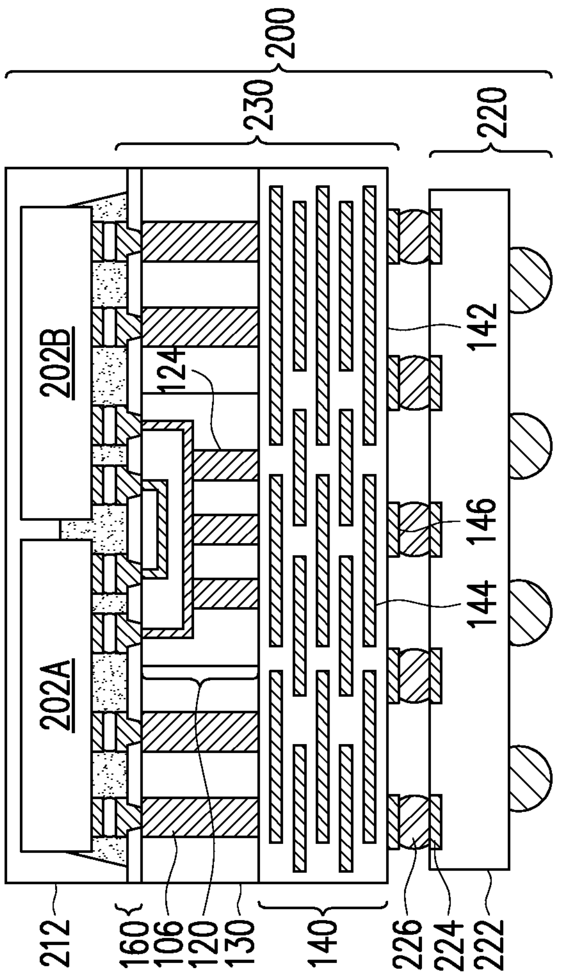

In FIG. 14, a singulation process is performed by cutting along scribe line region between the package regions 100P. The singulation process may include sawing, dicing, or the like. The singulation process singulates the package regions 100P from one another. The resulting, singulated integrated circuit packages 200 are from the package regions 100P. The singulation process forms interposers 230 from the singulated portions of the interposer wafer 100. As a result of the singulation process, the outer sidewalls of an interposer 230 and the encapsulant 212 are laterally coterminous (within process variations). The width of a package substrate 220 may be less than or similar to the width of an interposer 230.

FIGS. 15-19 are schematic cross-sectional views of a process for bonding a package substrate 220 to an interposer wafer 100, in accordance with some embodiments. One package region 100P (e.g., package substrate 220 and corresponding interposer 230) is shown, and some features are omitted from FIGS. 15-19 for illustration clarity. The package substrate 220 may have a large thickness. For example, the package substrate 220 may include multiple metallization layers, thereby having a large thickness. The package substrate 220 may be at a high risk of warpage on account of its large thickness. In some embodiments, the package substrate 220 has up to 134 μm of warpage. In this context, the amount of warpage of the package substrate 220 refers to the difference between the smallest distance between the package substrate 220 and the interposer 230 and the largest distance between the package substrate 220 and the interposer 230. To reduce the effects of warpage during the bonding to the interposer wafer 100, the conductive connectors 226 (e.g., solder connectors) are formed with different heights. The heights of the conductive connectors 226 may be controlled by controlling the volume of the conductive connectors 226 and/or the width of the bond pads 224. Specifically, the conductive connectors 226 can have a large height in regions where the package substrate 220 has a large amount of warpage, while the conductive connectors 226 can have a small height in regions where the package substrate 220 has a small amount of warpage. The quality of the conductive connectors 226 may thus be improved, such as by reducing the risk of forming cold solder joints and/or reducing the risk of solder necking.

In some embodiments, the conductive connectors 226 with a small height are located in the inner region of the package substrate 220, while the conductive connectors 226 with a large height are located in the outer region(s) of the package substrate 220. In other embodiments, the conductive connectors 226 with a small height are located in the outer region(s) of the package substrate 220, while the conductive connectors 226 with a large height are located in the inner region of the package substrate 220. The inner region of the package substrate 220 is the center of the package substrate 220. The outer region(s) of the package substrate 220 are the edge/corners of the package substrate 220. Specifically, the outer region(s) of the package substrate 220 may be the edge of the package substrate 220, may be the corners of the package substrate 220, or may be a combination thereof. The conductive connectors 226 in the outer region(s) of the package substrate 220 may be disposed around the conductive connectors 226 in the inner region of the package substrate 220.

Figure 15:
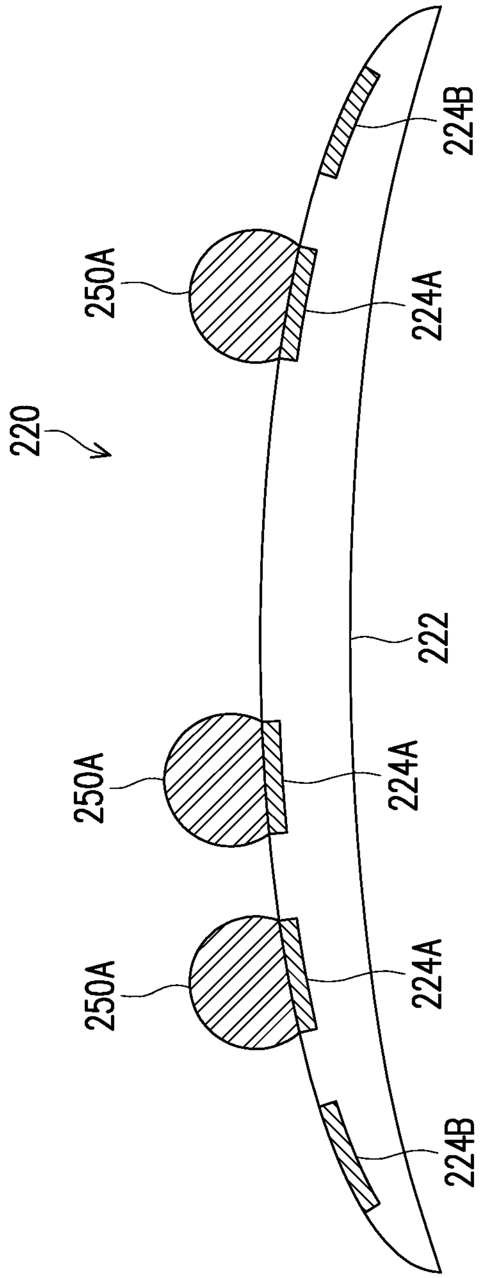
FIGS. 15-19 are schematic cross-sectional views of a process for bonding a package substrate to an interposer wafer, in accordance with some embodiments.

In FIG. 15, first reflowable connectors 250A are formed on a first subset of the bond pads 224A of a package substrate 220. The first reflowable connectors 250A may include a conductive material such as solder, copper, aluminum, gold, nickel, silver, palladium, tin, the like, or a combination thereof. In some embodiments, the first reflowable connectors 250A are formed by forming a layer of solder through evaporation, electroplating, printing, solder transfer, ball placement, or the like. The first bond pads 224A are disposed in regions where the package substrate 220 has a small amount of warpage, such as in the center of the package substrate 220 in this embodiment.

Figure 16:
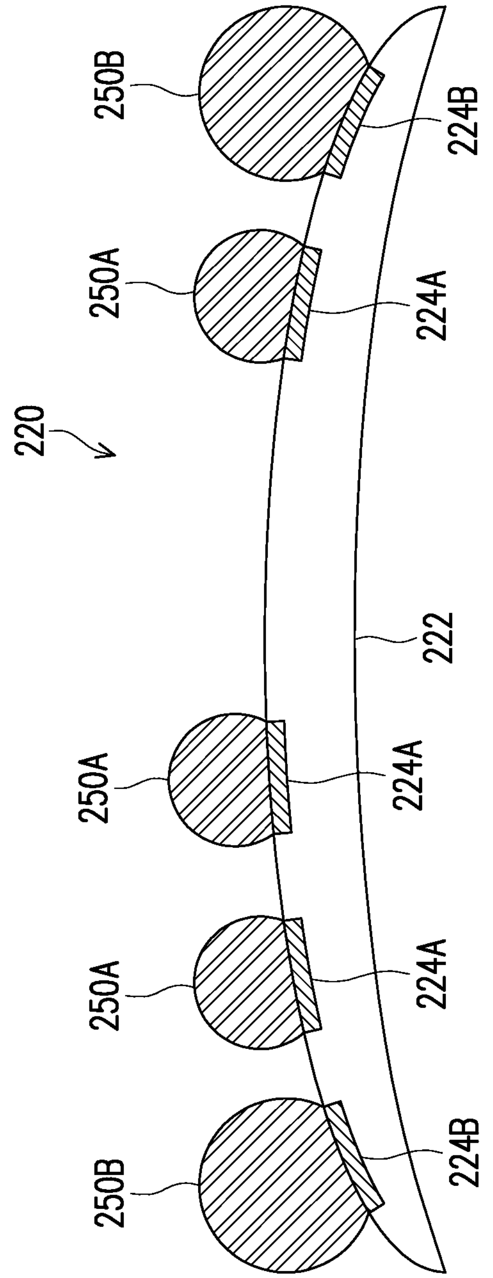

In FIG. 16, second reflowable connectors 250B are formed on a second subset of the bond pads 224B of the package substrate 220. The second reflowable connectors 250B may include a conductive material such as solder, copper, aluminum, gold, nickel, silver, palladium, tin, the like, or a combination thereof. In some embodiments, the second reflowable connectors 250B are formed by forming a layer of solder through evaporation, electroplating, printing, solder transfer, ball placement, or the like. The second bond pads 224B are disposed in regions where the package substrate 220 has a large amount of warpage, such as at the edge/corners of the package substrate 220 in this embodiment. The second bond pads 224B may be disposed around the first bond pads 224A.

In some embodiments, the material (e.g., solder) of the first reflowable connectors 250A and the second reflowable connectors 250B is initially formed by the previously described methods. Once a layer of solder has been formed on the structure, a reflow may be performed in order to shape the material into the desired bump shapes. Thus, a single reflow may be performed when forming both the first reflowable connectors 250A and the second reflowable connectors 250B.

In this embodiment, the heights of the conductive connectors 226 (see FIG. 19) are controlled by controlling the volume of the first reflowable connectors 250A and the second reflowable connectors 250B. Meanwhile, the first bond pads 224A and the second bond pads 224B have the same width. The second reflowable connectors 250B have a greater volume than the first reflowable connectors 250A. In some embodiments, a ratio of the volume of the second reflowable connectors 250B to the volume of the first reflowable connectors 250A is in the range of 0.3 to 3. The second reflowable connectors 250B have a greater height than the first reflowable connectors 250A. In some embodiments, a ratio of the height of the second reflowable connectors 250B to the height of the first reflowable connectors 250A is in the range of 1.1 to 1.7, such as in the range of 1.1 to 1.5. In some embodiments, a ratio of the width of the second reflowable connectors 250B to the width of the first reflowable connectors 250A is in the range of 1.1 to 1.7, such as in the range of 1.1 to 1.5.

Figure 17:
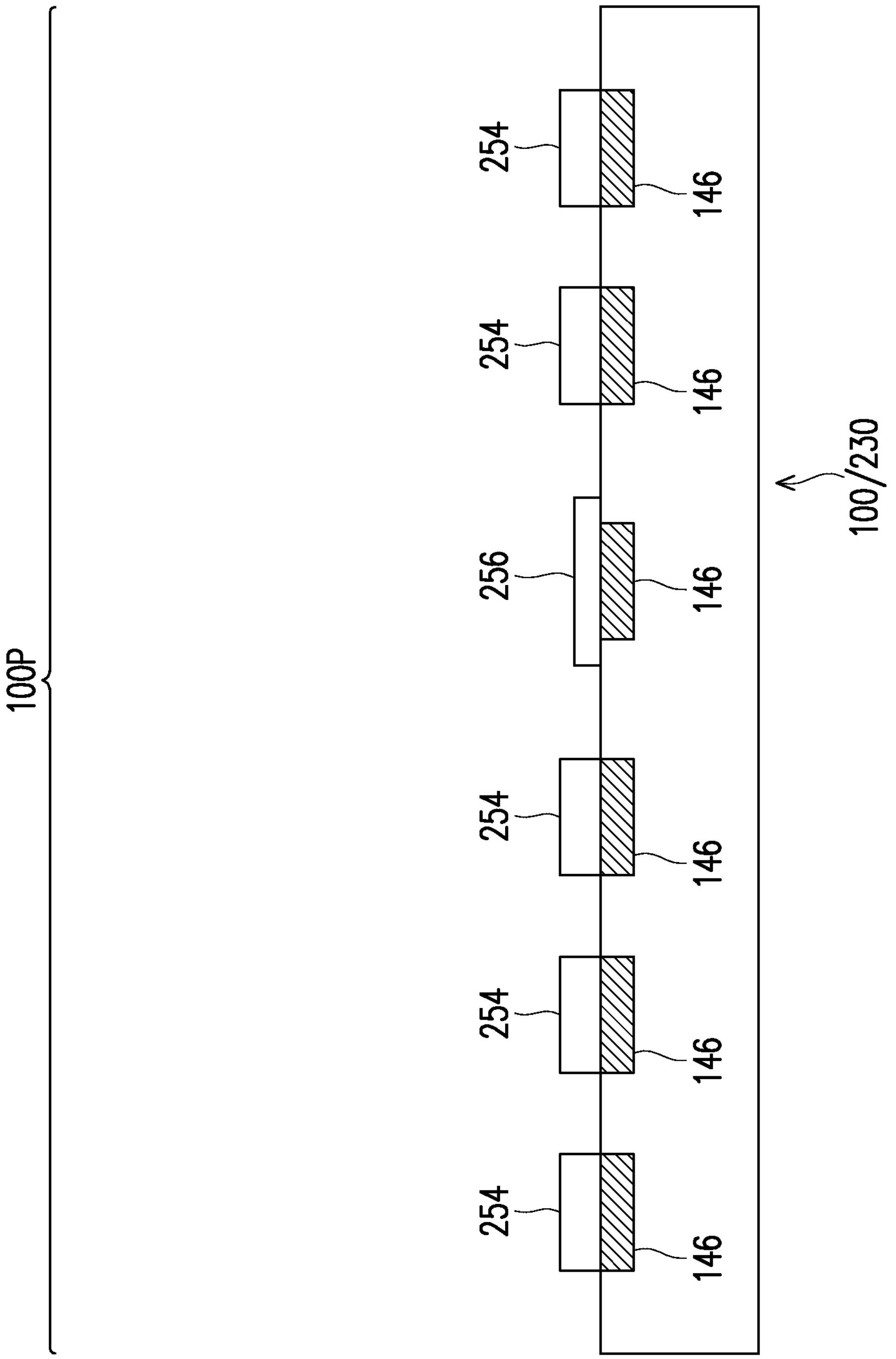

In FIG. 17, reflowable layers 254 are formed on UBMs 146 of an interposer 230. The reflowable layers 254 may be formed of a conductive paste such as solder paste, solder-bismuth paste, silver paste, or the like, which may be dispensed in a printing process. Additionally, passive devices 256 may be bonded to some of the UBMs 146 of the interposer 230, as previously described.

Figure 18:
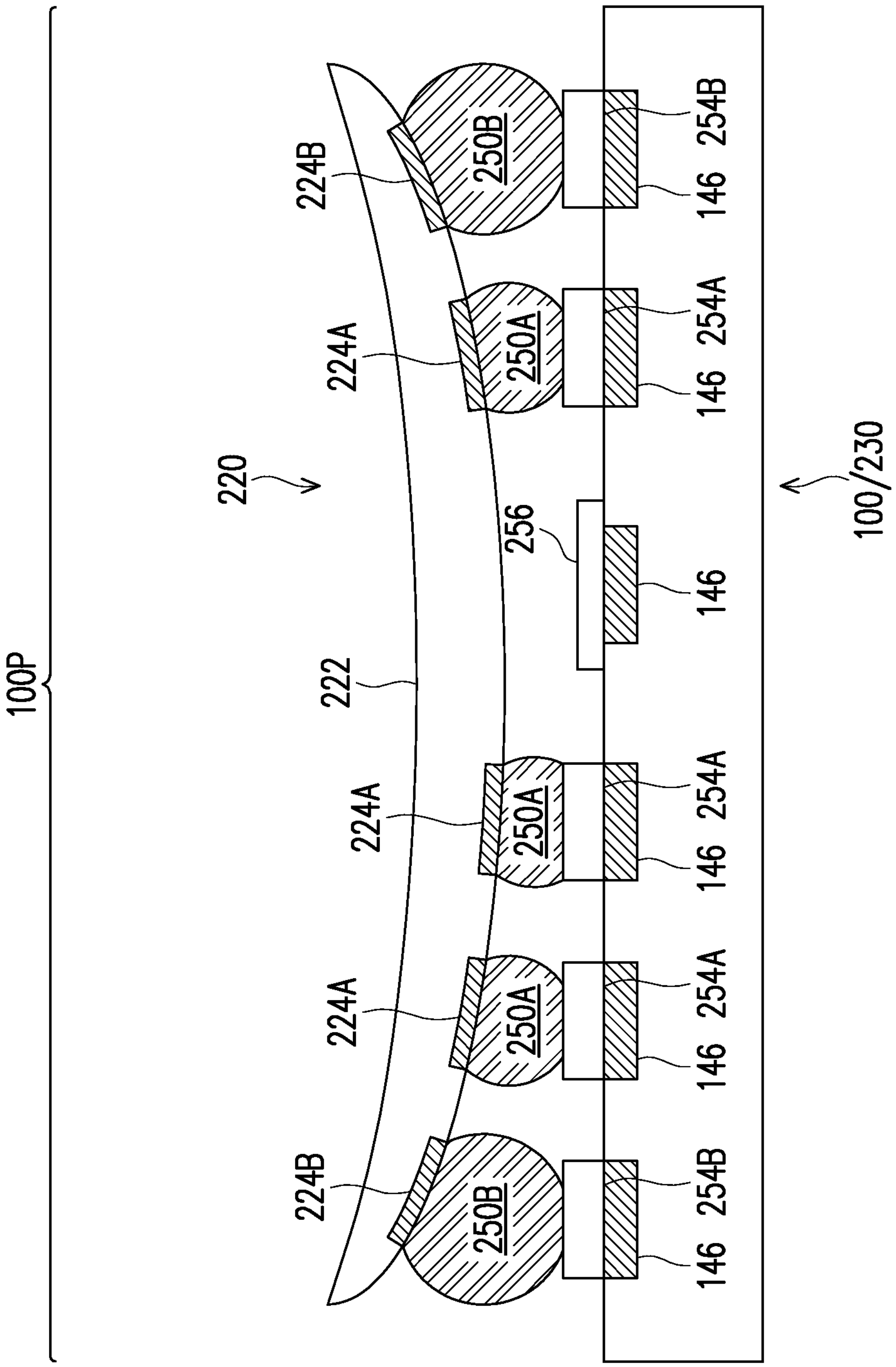

In FIG. 18, the package substrate 220 is placed on the front side of the interposer wafer 100. The reflowable connectors 250 (including the first reflowable connectors 250A and the second reflowable connectors 250B) are aligned with respective reflowable layers 254 (if present) and UBMs 146. As a result of the second reflowable connectors 250B having a greater volume than the first reflowable connectors 250A, the second reflowable connectors 250B may be able to physically contact the corresponding reflowable layers 254 even when the package substrate 220 is warped. Similarly, the first reflowable connectors 250A may physically contact the corresponding reflowable layers 254. Accordingly, there may be no gaps between the reflowable layers 254 and any of the corresponding reflowable connectors 250 (including the first reflowable connectors 250A and the second reflowable connectors 250B).

In some embodiments, the subset of the reflowable layers 254B in contact with the second reflowable connectors 250B have a greater volume than the subset of the reflowable layers 254A in contact with the first reflowable connectors 250A. For example, the reflowable layers 254B may be wider and/or thicker than the reflowable layers 254A. As a result, the risk of gaps being formed between the reflowable layers 254B and the second reflowable connectors 250B may be reduced.

Figure 19:
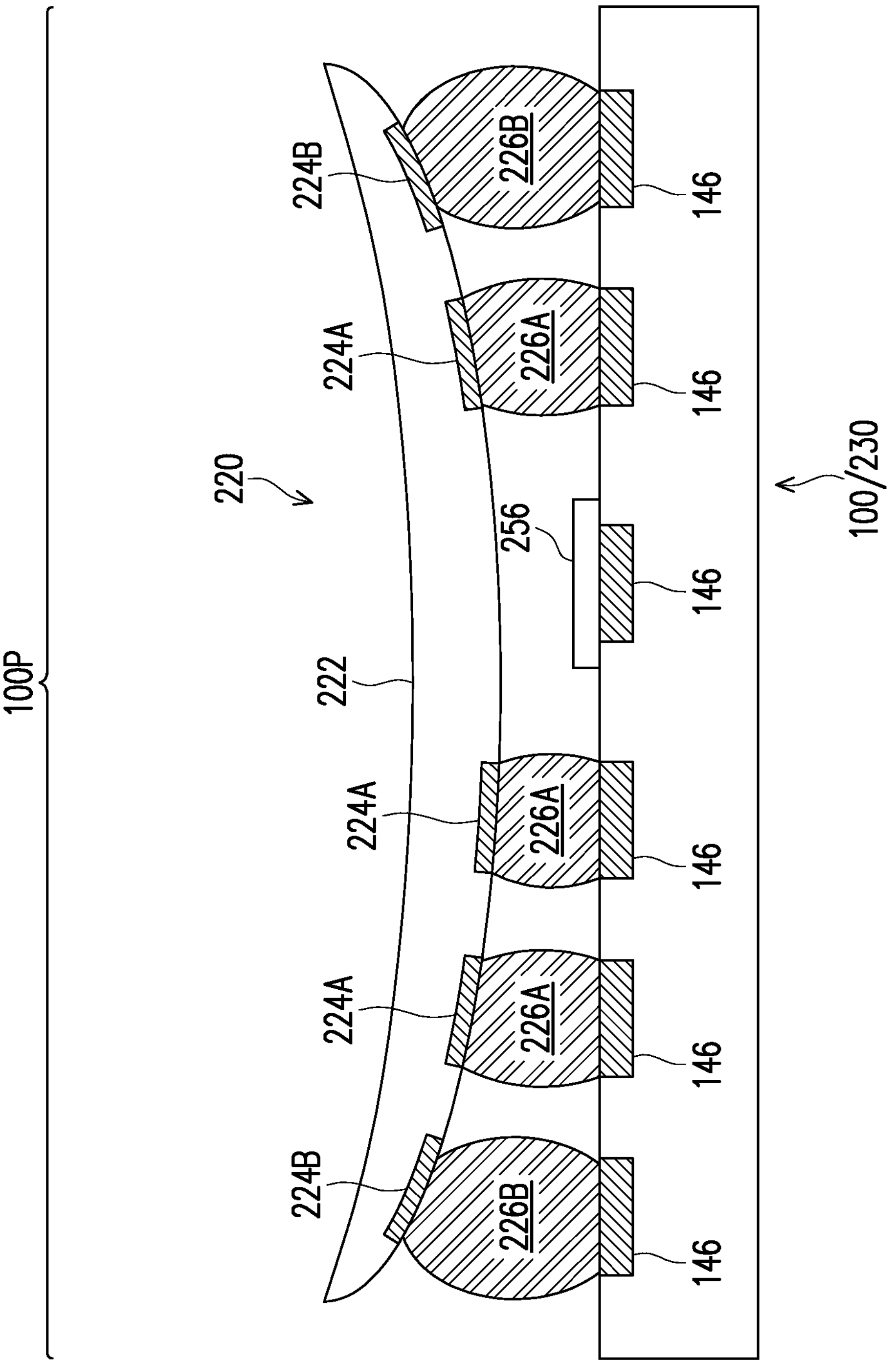

In FIG. 19, the reflowable layers 254 and the reflowable connectors 250 are reflowed to form the conductive connectors 226. The reflowable layers 254 and the reflowable connectors 250 may be reflowed by a suitable annealing process. During reflow, the material of a reflowable layer 254 intermingles with the material of a reflowable connector 250 to form a conductive connector 226. The resulting conductive connectors 226 may be ball grid array (BGA) connectors, solder balls, controlled collapse chip connection (C4) bumps, or the like.

As a result of the second reflowable connectors 250B having a greater volume than the first reflowable connectors 250A, the subset of the second conductive connectors 226B coupled to the second bond pads 224B have a greater volume and a greater height than the subset of the first conductive connectors 226A coupled to the first bond pads 224A. The height of the second conductive connectors 226B may be less than twice the height of the first conductive connectors 226A. In some embodiments, a ratio of the height of the second conductive connectors 226B to the height of the first conductive connectors 226A is in the range of 1.1 to 1.7, such as in the range of 1.1 to 1.5. Such a height ratio may help avoid solder necking and/or cold solder joints. In some embodiments, the height of the first conductive connectors 226A is in the range of 50 μm to 600 μm and the height of the second conductive connectors 226B is in the range of 250 μm to 800 μm. The height of the conductive connectors 226 is measured in a direction extending between the interposer 230 and the package substrate 220.

The second conductive connectors 226B and the second bond pads 224B are disposed in regions where the package substrate 220 has more warpage than the regions where the first conductive connectors 226A and the first bond pads 224A are disposed. The increased height of the second conductive connectors 226B helps compensate for the warpage of the package substrate 220 in the regions that are warped. As a result, the risk of the conductive connectors 226 being cold solder joints and/or experiencing solder necking may be reduced. As a result of avoiding solder necking, each of the conductive connectors 226 (including the second conductive connectors 226B) may have convex sidewalls. The quality of the conductive connectors 226 may thus be increased and the reliability of the integrated circuit packages 200 may be improved.

Figure 20B:
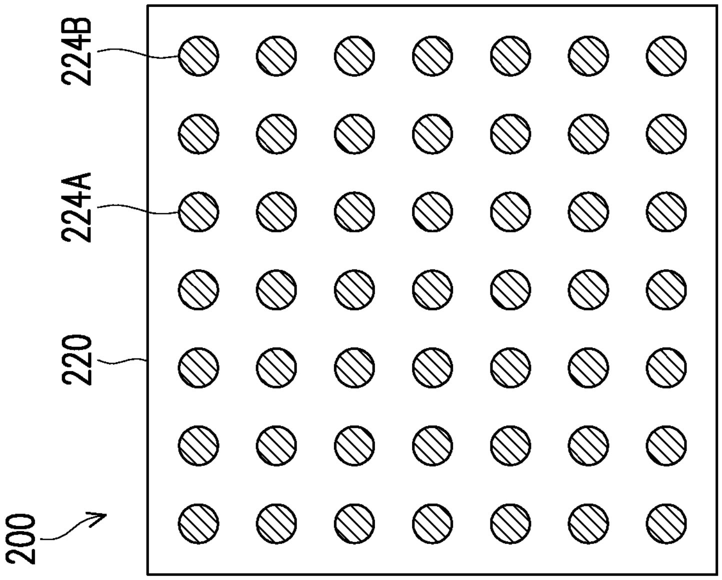
FIGS. 20A-20B are top-down views of an integrated circuit package, in accordance with some embodiments.
Figure 20A:
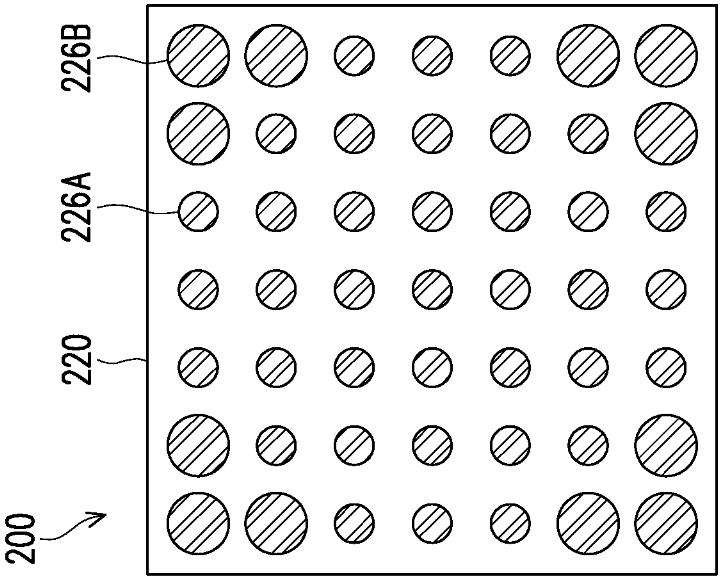

FIGS. 20A-20B are top-down views of an integrated circuit package 200 that includes the package substrate 220 of FIG. 19, in accordance with some embodiments. Specifically, FIG. 20A shows the layout of the conductive connectors 226 while FIG. 20B shows the layout of the bond pads 224. The second conductive connectors 226B are formed in the edge/corners of the package substrate 220 while the first conductive connectors 226A are formed in the center of the package substrate 220. In this embodiment where the heights of the conductive connectors 226 (see FIG. 18) are controlled by controlling the volume of the conductive connectors 226, the second bond pads 224 (including the first bond pads 224A and the second bond pads 224B) have the same width. The width of the second conductive connectors 226B is greater than the width of the first conductive connectors 226A.

Figure 21:
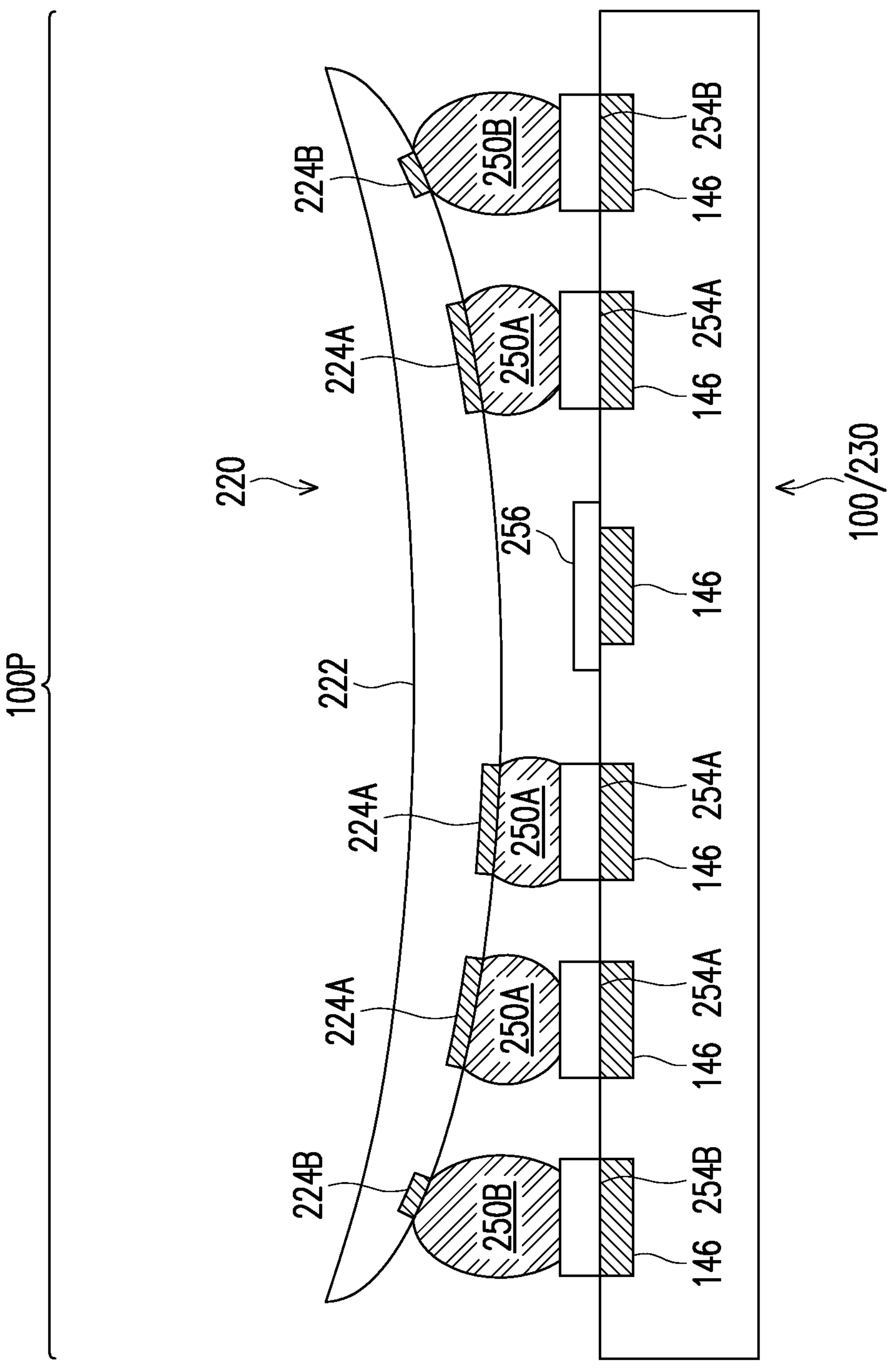
FIGS. 21-22 are schematic cross-sectional views of a process for bonding a package substrate to an interposer wafer, in accordance with some embodiments.
Figure 22:
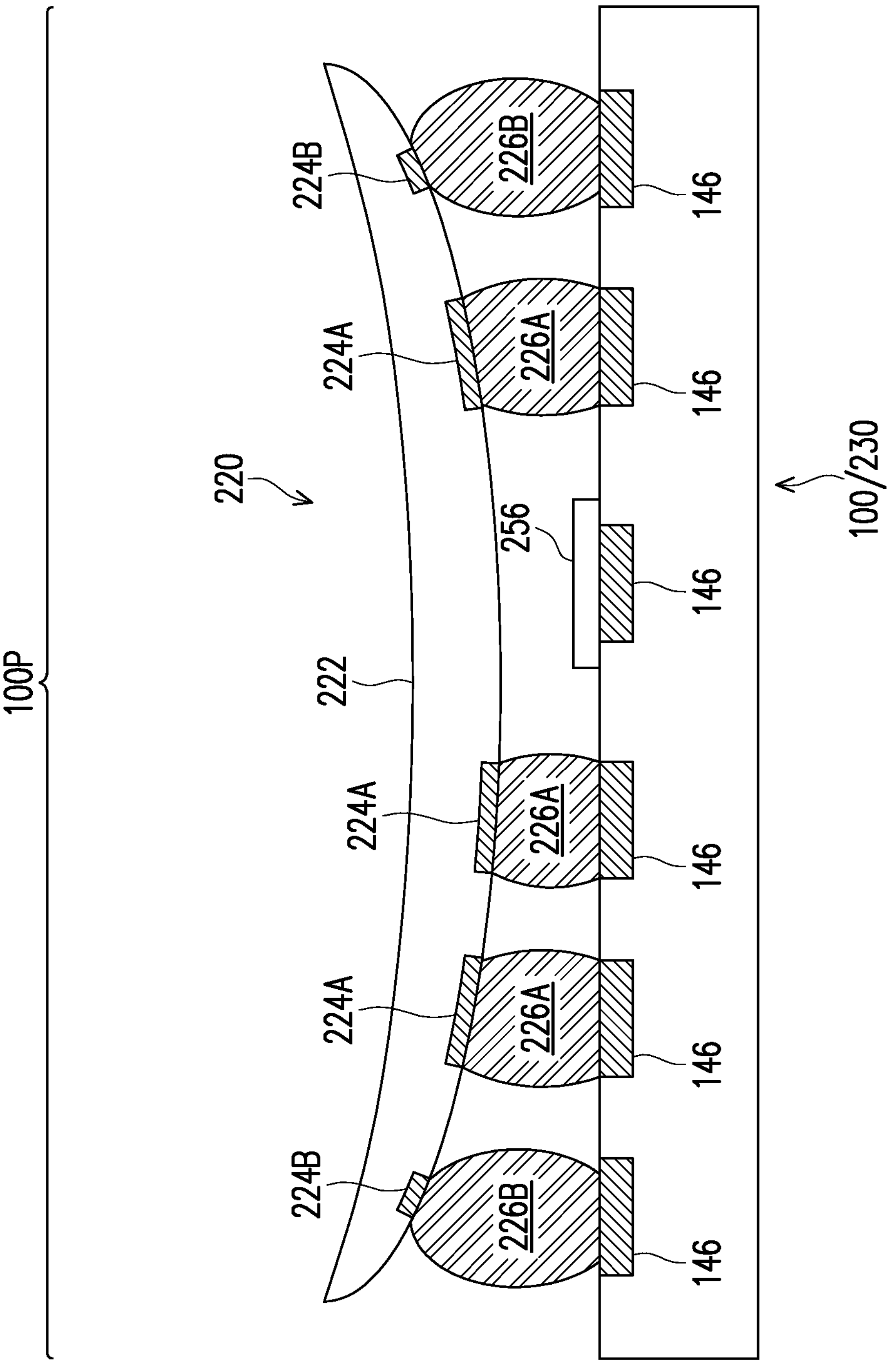

FIGS. 21-22 are schematic cross-sectional views of a process for bonding a package substrate 220 to an interposer wafer 100, in accordance with some embodiments. One package region 100P (e.g., package substrate 220 and corresponding interposer 230) is shown, and some features are omitted from FIGS. 21-22 for illustration clarity.

In FIG. 21, first reflowable connectors 250A are formed on a first subset of the first bond pads 224A of a package substrate 220. The first reflowable connectors 250A may be formed in a similar manner as described for FIG. 15. Additionally, second reflowable connectors 250B are formed on a second subset of the second bond pads 224B of the package substrate 220. The second reflowable connectors 250B may be formed in a similar manner as described for FIG. 16. Reflowable layers 254 are formed on UBMs 146 of an interposer 230. The reflowable layers 254 may be formed in a similar manner as described for FIG. 17.

In this embodiment, the heights of the conductive connectors 226 (see FIG. 22) are controlled by controlling the widths of the bond pads 224. Meanwhile, the first reflowable connectors 250A and the second reflowable connectors 250B have the same volume. The second bond pads 224B have a smaller width than the first bond pads 224A. In some embodiments, a ratio of the width of the second bond pads 224B to the width of the first bond pads 224A is in the range of 0.5 to 0.8. As a result of the second bond pads 224B having a smaller width than the first bond pads 224A, the second reflowable connectors 250B have a smaller width and a greater height than the first reflowable connectors 250A. In some embodiments, a ratio of the height of the second reflowable connectors 250B to the height of the first reflowable connectors 250A is in the range of 1.1 to 1.7, such as in the range of 1.1 to 1.5. In some embodiments, a ratio of the width of the second reflowable connectors 250B to the width of the first reflowable connectors 250A is in the range of 0.4 to 2.5.

In FIG. 22, the reflowable layers 254 and the reflowable connectors 250 are reflowed to form the conductive connectors 226. The reflowable layers 254 and the reflowable connectors 250 may be reflowed in a similar manner as described for FIG. 19.

As a result of the second bond pads 224B having a smaller width than the first bond pads 224A, the second conductive connectors 226B coupled to the second bond pads 224B have a greater height than the first conductive connectors 226A coupled to the first bond pads 224A. The height of the second conductive connectors 226B may be less than twice the height of the first conductive connectors 226A. In some embodiments, a ratio of the height of the second conductive connectors 226B to the height of the first conductive connectors 226A is in the range of 1.1 to 1.7, such as in the range of 1.1 to 1.5. Such a height ratio may help avoid solder necking and/or cold solder joints. In some embodiments, the height of the first conductive connectors 226A is in the range of 50 μm to 600 μm and the height of the second conductive connectors 226B is in the range of 250 μm to 800 μm. The height of the conductive connectors 226 is measured in a direction extending between the interposer 230 and the package substrate 220.

Figure 23B:
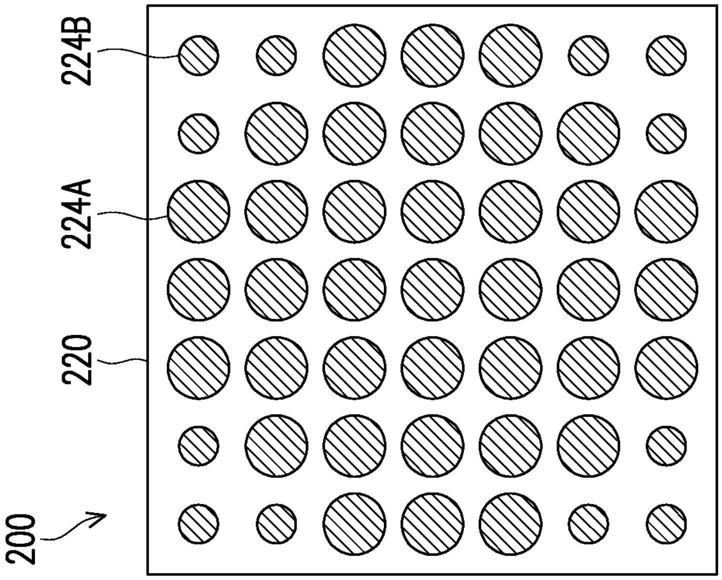
FIGS. 23A-23B are top-down views of an integrated circuit package, in accordance with some embodiments.
Figure 23A:
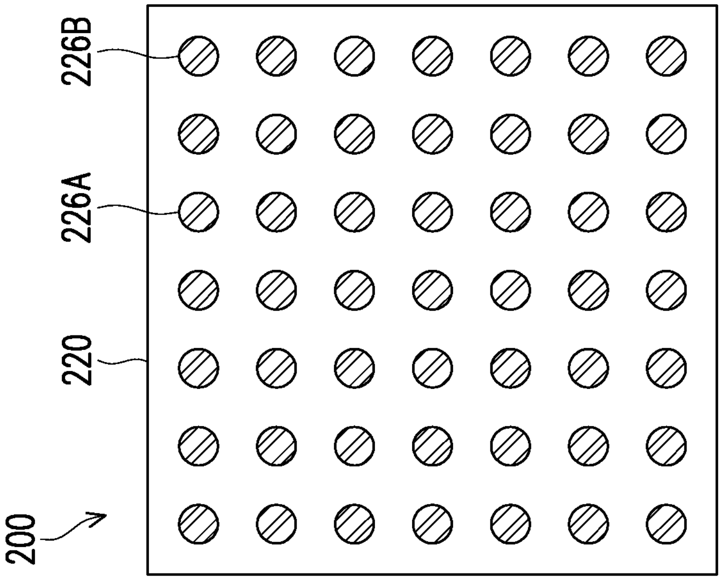

FIGS. 23A-23B are top-down views of an integrated circuit package 200 that includes the package substrate 220 of FIG. 22, in accordance with some embodiments. Specifically, FIG. 23A shows the layout of the conductive connectors 226 while FIG. 23B shows the layout of the bond pads 224. The second conductive connectors 226B are formed in the edge/corners of the package substrate 220 while the first conductive connectors 226A are formed in the center of the package substrate 220. In this embodiment where the heights of the conductive connectors 226 (see FIG. 22) are controlled by controlling the widths of the bond pads 224, the conductive connectors 226 (including the first conductive connectors 226A and the second conductive connectors 226B) have the same volume. The width of the second bond pads 224B is greater than the width of the first bond pads 224A.

Figure 24:
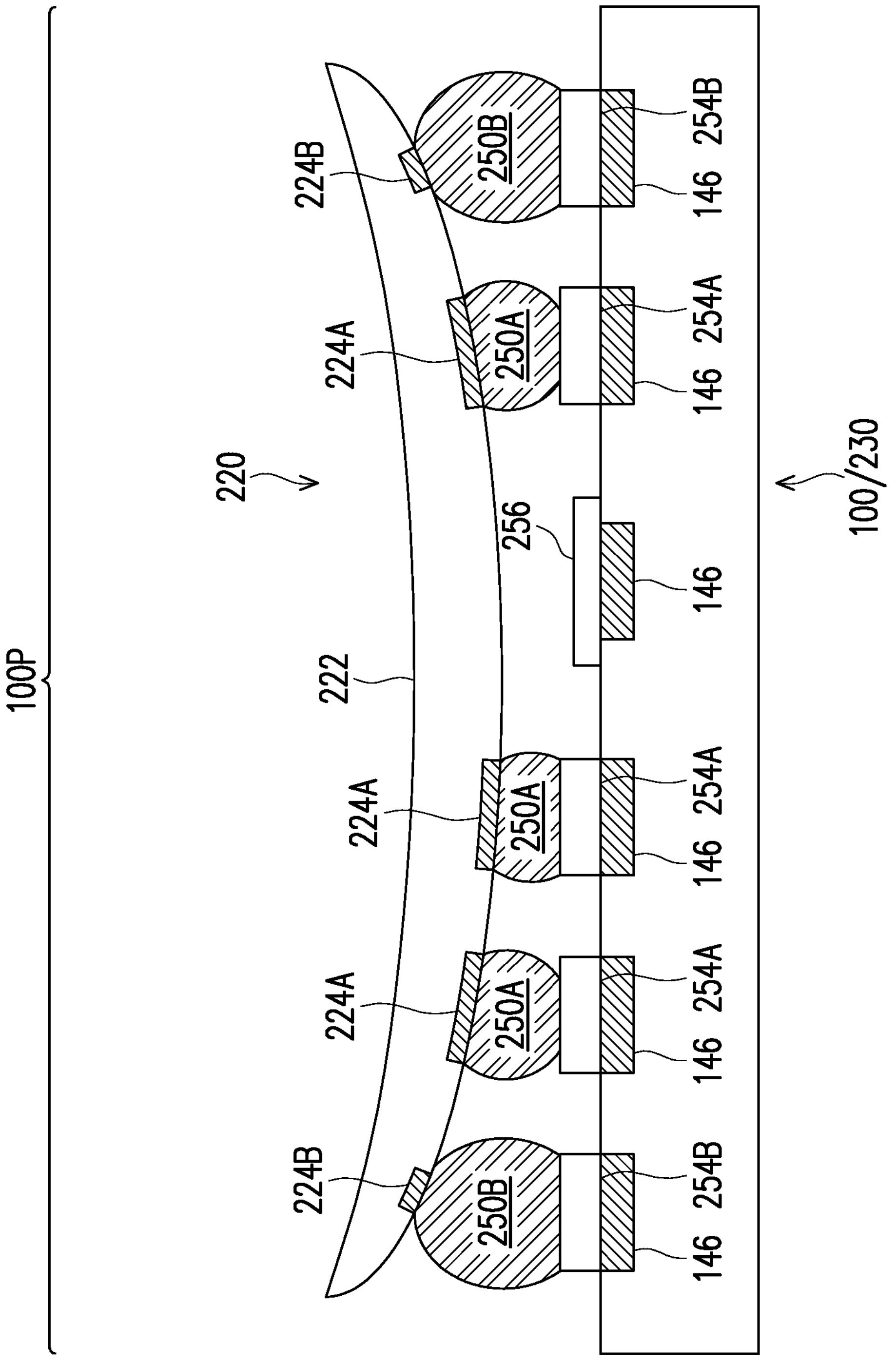
FIGS. 24-25 are schematic cross-sectional views of a process for bonding a package substrate to an interposer wafer, in accordance with some embodiments.
Figure 25:
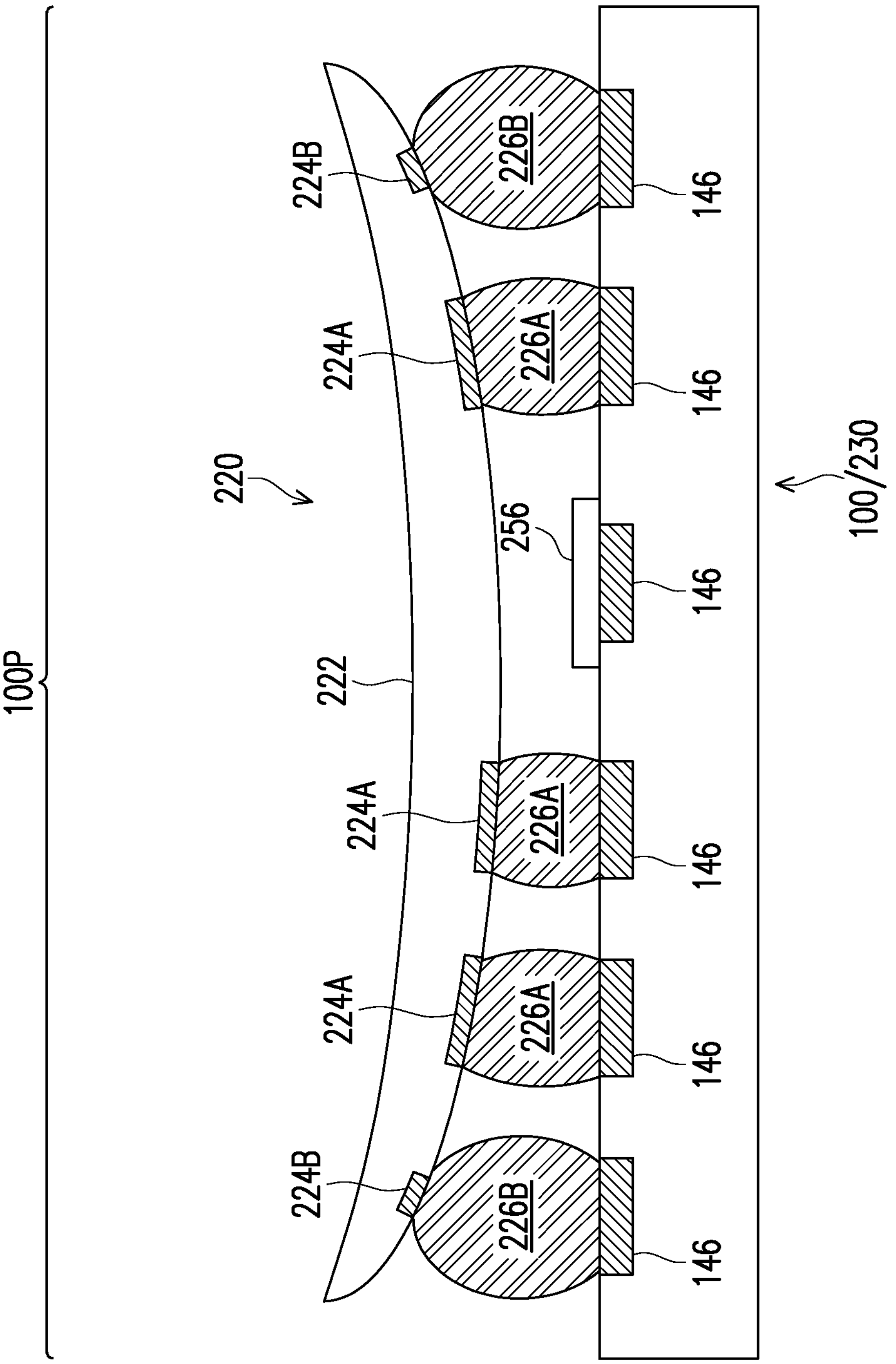

FIGS. 24-25 are schematic cross-sectional views of a process for bonding a package substrate 220 to an interposer wafer 100, in accordance with some embodiments. One package region 100P (e.g., package substrate 220 and corresponding interposer 230) is shown, and some features are omitted from FIGS. 24-25 for illustration clarity. This embodiment is similar to the embodiment of FIGS. 21-22, except the heights of the conductive connectors 226 (see FIG. 25) are controlled by both controlling the widths of the bond pads 224 and also controlling the volume of the first reflowable connectors 250A and the second reflowable connectors 250B. As a result, the second conductive connectors 226B have a greater volume than the first conductive connectors 226A, and the second bond pads 224B have a smaller width than the first bond pads 224A.

Figure 26B:
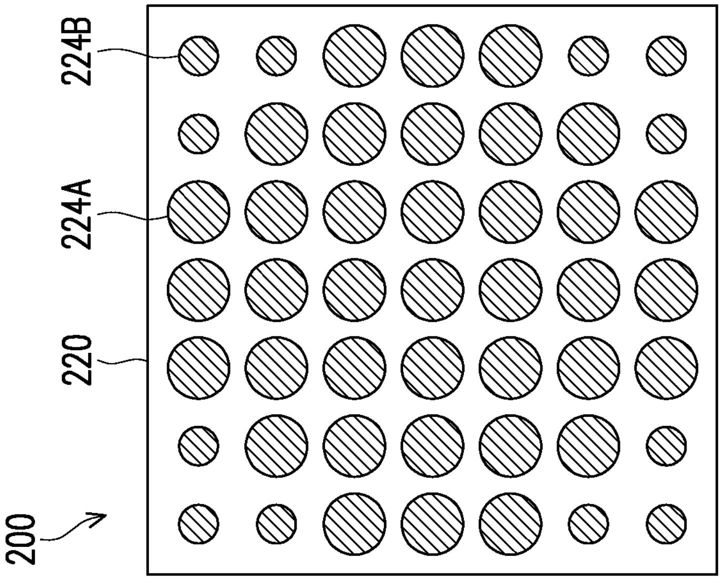
FIGS. 26A-26B are top-down views of an integrated circuit package, in accordance with some embodiments.
Figure 26A:
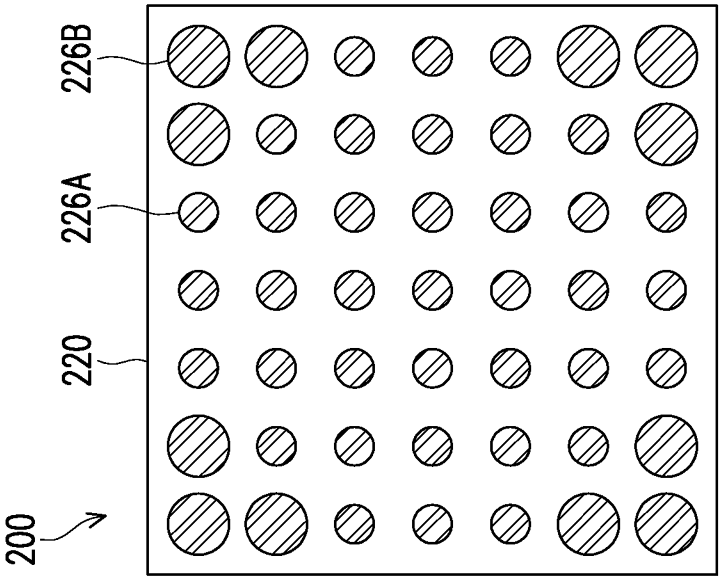

FIGS. 26A-26B are top-down views of an integrated circuit package 200 that includes the package substrate 220 of FIG. 25, in accordance with some embodiments. Specifically, FIG. 26A shows the layout of the conductive connectors 226 while FIG. 26B shows the layout of the bond pads 224. The second conductive connectors 226B and the second bond pads 224B are formed in the edge/corners of the package substrate 220 while the first conductive connectors 226A and the first bond pads 224A are formed in the center of the package substrate 220. Up to half of the second conductive connectors 226B may have a greater volume than the first conductive connectors 226A, and up to half of the second bond pads 224B may have a smaller width than the first bond pads 224A. The width of the second conductive connectors 226B is greater than the width of the first conductive connectors 226A.

Figure 27:
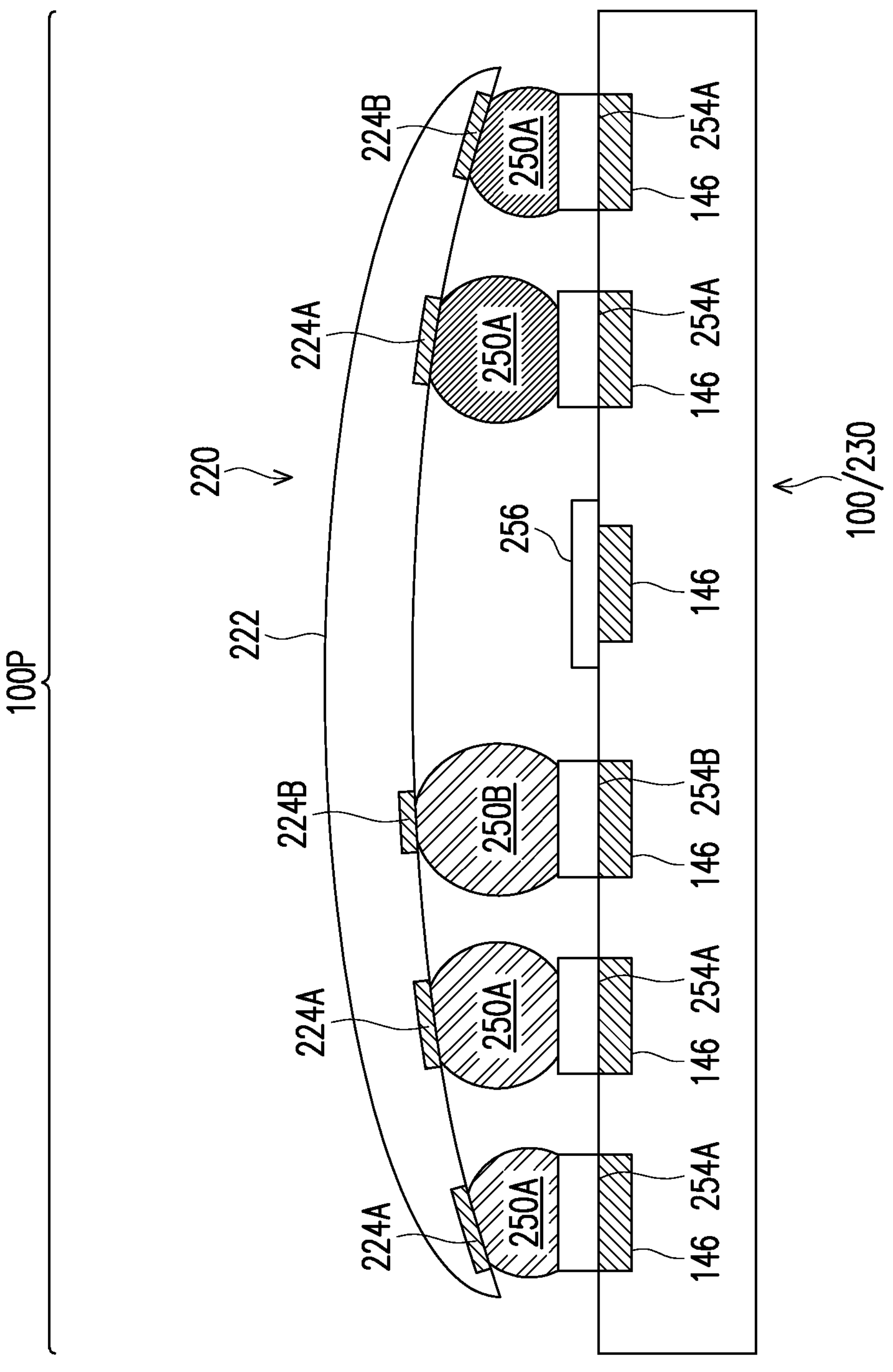
FIGS. 27-28 are schematic cross-sectional views of a process for bonding a package substrate to an interposer wafer, in accordance with some embodiments.
Figure 28:
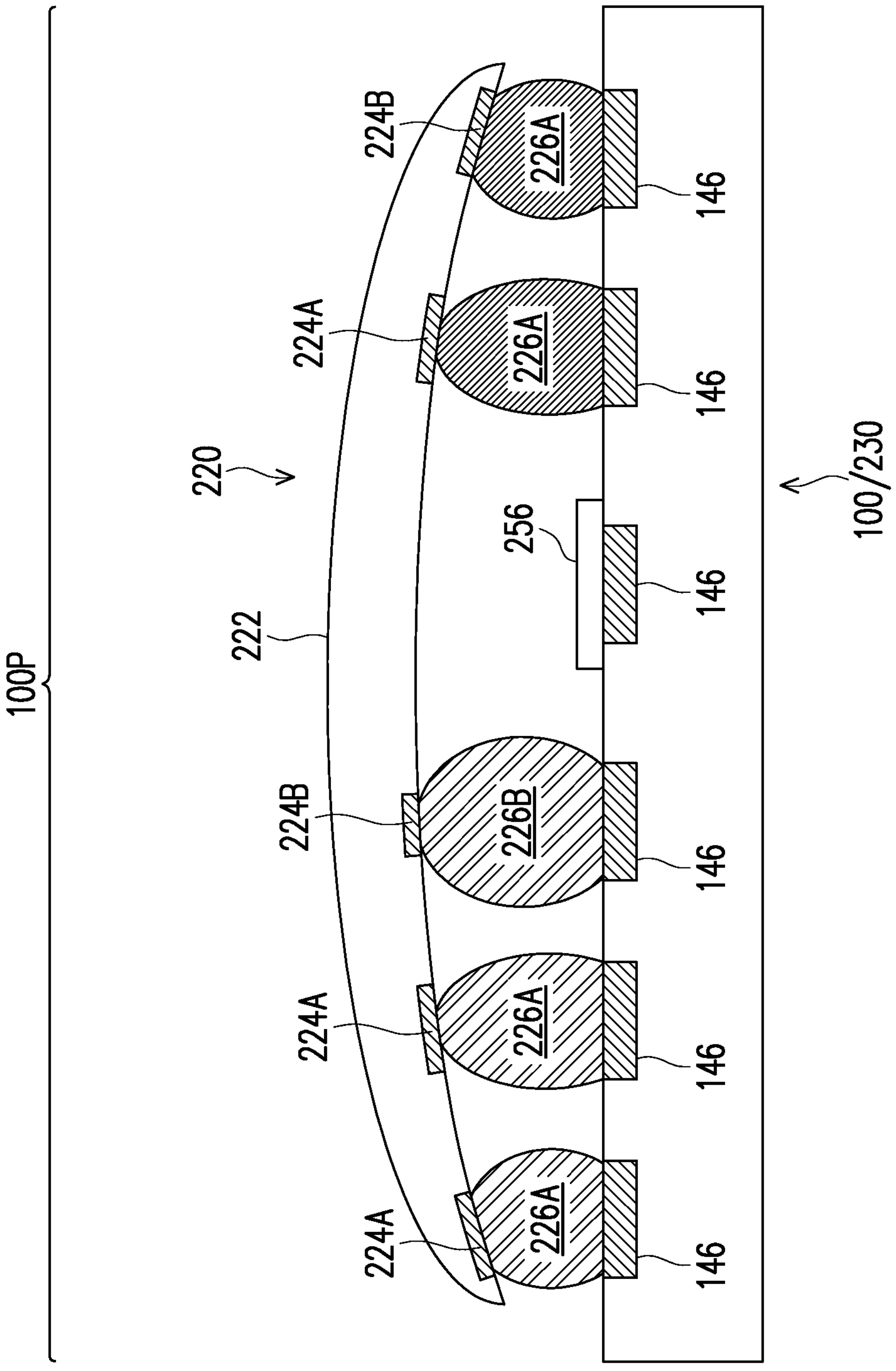

FIGS. 27-28 are schematic cross-sectional views of a process for bonding a package substrate 220 to an interposer wafer 100, in accordance with some embodiments. One package region 100P (e.g., package substrate 220 and corresponding interposer 230) is shown, and some features are omitted from FIGS. 27-28 for illustration clarity. This embodiment is similar to the embodiment of FIGS. 24-25, except the package substrate 220 has a large amount of warpage in the center. Thus, the second conductive connectors 226B with an increased height are formed at the center of the package substrate 220.

Figure 29B:
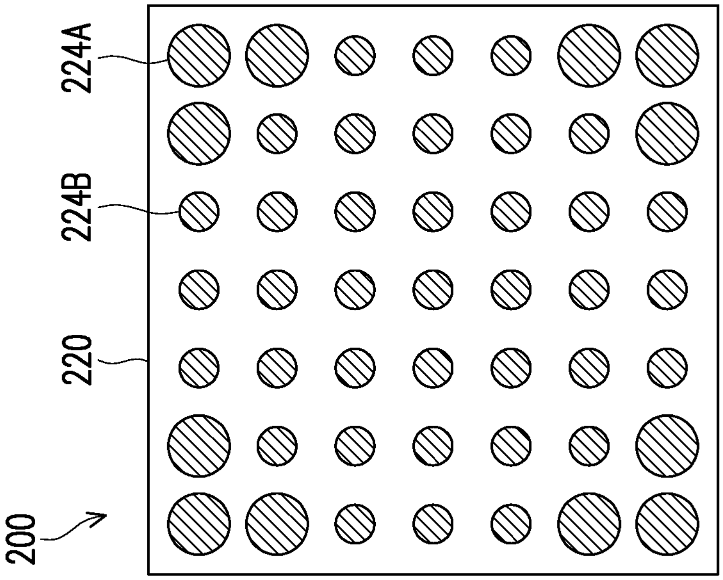
FIGS. 29A-29B are top-down views of an integrated circuit package, in accordance with some embodiments.
Figure 29A:
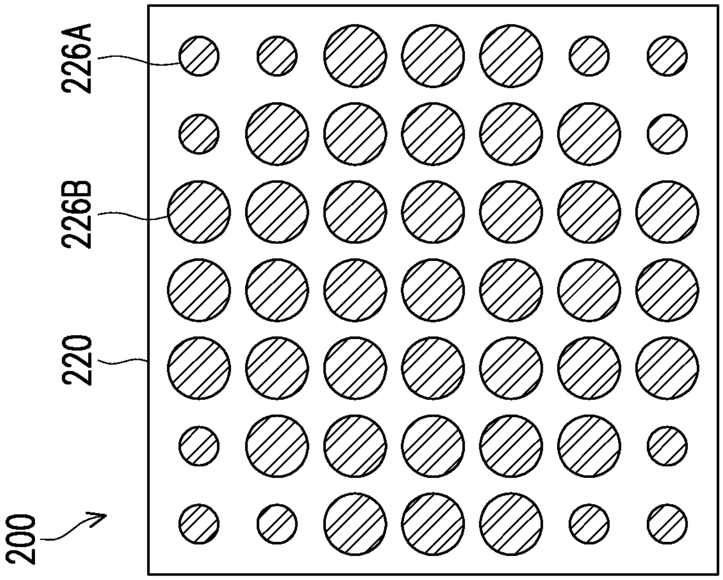

FIGS. 29A-29B are top-down views of an integrated circuit package 200 that includes the package substrate 220 of FIG. 28, in accordance with some embodiments. Specifically, FIG. 29A shows the layout of the conductive connectors 226 while FIG. 29B shows the layout of the bond pads 224. The second conductive connectors 226B and the second bond pads 224B are formed in the center of the package substrate 220 while the first conductive connectors 226A and the first bond pads 224A are formed in the edge/corners of the package substrate 220. Up to half of the second conductive connectors 226B may have a greater volume than the first conductive connectors 226A, and up to half of the second bond pads 224B may have a smaller width than the first bond pads 224A. The width of the second conductive connectors 226B is greater than the width of the first conductive connectors 226A.

Embodiments may achieve advantages. As previously described, the second reflowable connectors 250B may have a greater volume than the first reflowable connectors 250A and/or the second bond pads 224B may have a smaller width than the first bonds pads 224A. This may cause the second conductive connectors 226B to have a greater height than the first conductive connectors 226A. Forming the conductive connectors 226 (e.g., solder connectors) with different heights may reduce the effects of warpage during the bonding of the package substrates 220 to the interposer wafer 100. The risk of forming cold solder joints and/or the risk of solder necking may thus be reduced. As a result of avoiding solder necking, each of the conductive connectors 226 (including the second conductive connectors 226B) may have convex sidewalls. The quality of the conductive connectors 226 may thus be improved.

In an embodiment, a device includes: an interposer; a package substrate; and conductive connectors bonding the package substrate to the interposer, each of the conductive connectors having convex sidewalls, a first subset of the conductive connectors disposed in a center of the package substrate in a top-down view, a second subset of the conductive connectors disposed in an edge/corner of the package substrate in the top-down view, each of the second subset of the conductive connectors having a greater height than each of the first subset of the conductive connectors. In some embodiments of the device, a height of the second subset of the conductive connectors is less than twice than a height of the first subset of the conductive connectors. In some embodiments of the device, the second subset of the conductive connectors have a greater volume than the first subset of the conductive connectors. In some embodiments of the device, the second subset of the conductive connectors have the same volume as the first subset of the conductive connectors. In some embodiments of the device, the package substrate includes bond pads, a first subset of the bond pads coupled to the first subset of the conductive connectors, a second subset of the bond pads coupled to the second subset of the conductive connectors, the first subset of the bond pads having a greater width than the second subset of the bond pads. In some embodiments of the device, the package substrate includes bond pads, a first subset of the bond pads coupled to the first subset of the conductive connectors, a second subset of the bond pads coupled to the second subset of the conductive connectors, the first subset of the bond pads having the same width as the second subset of the bond pads.

In an embodiment, a method includes: forming first reflowable connectors on a package substrate, the first reflowable connectors disposed in a first region of the package substrate; after forming the first reflowable connectors, forming second reflowable connectors on the package substrate, the second reflowable connectors disposed in a second region of the package substrate, the second reflowable connectors having a greater height than the first reflowable connectors; forming reflowable layers on an interposer; contacting each of the first reflowable connectors and the second reflowable connectors to corresponding ones of the reflowable layers; and reflowing the first reflowable connectors, the second reflowable connectors, and the reflowable layers to bond the package substrate to the interposer. In some embodiments of the method, the first region is a center of the package substrate in a top-down view, and the second region is an edge/corner of the package substrate in the top-down view. In some embodiments of the method, the first region is an edge/corner of the package substrate in a top-down view, and the second region is a center of the package substrate in the top-down view. In some embodiments of the method, the first reflowable connectors are contacted to a first subset of the reflowable layers, the second reflowable connectors are contacted to a second subset of the reflowable layers, and forming the reflowable layers includes: printing the first subset of the reflowable layers to a first thickness; and printing the second subset of the reflowable layers to a second thickness, the second thickness greater than the first thickness. In some embodiments of the method, the first reflowable connectors are formed on a first subset of bond pads of the package substrate, the second reflowable connectors are formed on a second subset of the bond pads of the package substrate, the second reflowable connectors have a greater volume than the first reflowable connectors, and the first subset of the bond pads have the same width as the second subset of the bond pads. In some embodiments of the method, the first reflowable connectors are formed on a first subset of bond pads of the package substrate, the second reflowable connectors are formed on a second subset of the bond pads of the package substrate, the second reflowable connectors have the same volume as the first reflowable connectors, and the first subset of the bond pads have a greater width than the second subset of the bond pads. In some embodiments of the method, the first reflowable connectors are formed on a first subset of bond pads of the package substrate, the second reflowable connectors are formed on a second subset of the bond pads of the package substrate, the second reflowable connectors have a greater volume than the first reflowable connectors, and the first subset of the bond pads have a greater width than the second subset of the bond pads.

In an embodiment, a method includes: forming first reflowable connectors on a first subset of bond pads of a package substrate, the first reflowable connectors disposed in a center of the package substrate in a top-down view; forming second reflowable connectors on a second subset of the bond pads of the package substrate, the second reflowable connectors disposed in an edge/corner of the package substrate in the top-down view, the second reflowable connectors having a greater height than the first reflowable connectors; after forming the first reflowable connectors and the second reflowable connectors, placing the package substrate on an interposer; and reflowing the first reflowable connectors and the second reflowable connectors to bond the package substrate to the interposer. In some embodiments of the method, the second reflowable connectors have a greater volume than the first reflowable connectors, and the first subset of the bond pads have the same width as the second subset of the bond pads. In some embodiments of the method, the second reflowable connectors have the same volume as the first reflowable connectors, and the first subset of the bond pads have a greater width than the second subset of the bond pads. In some embodiments of the method, the second reflowable connectors have a greater volume than the first reflowable connectors, and the first subset of the bond pads have a greater width than the second subset of the bond pads. In some embodiments of the method, the interposer includes reflowable layers, a first subset of the reflowable layers are in contact with the first reflowable connectors, a second subset of the reflowable layers are in contact with the second reflowable connectors, the first reflowable connectors and the first subset of the reflowable layers are reflowed to form first conductive connectors, the second reflowable connectors and the second subset of the reflowable layers are reflowed to form second conductive connectors, and a second height of the second conductive connectors is greater than a first height of the first conductive connectors. In some embodiments of the method, the interposer includes reflowable layers, a first subset of the reflowable layers are in contact with the first reflowable connectors, a second subset of the reflowable layers are in contact with the second reflowable connectors, and the second subset of the reflowable layers are thicker than the first subset of the reflowable layers. In some embodiments of the method, the interposer includes reflowable layers, a first subset of the reflowable layers are in contact with the first reflowable connectors, a second subset of the reflowable layers are in contact with the second reflowable connectors, and the second subset of the reflowable layers are wider than the first subset of the reflowable layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming first reflowable connectors on a package substrate, the first reflowable connectors disposed in a first region of the package substrate;

after forming the first reflowable connectors, forming second reflowable connectors on the package substrate, the second reflowable connectors disposed in a second region of the package substrate, the second reflowable connectors having a greater height than the first reflowable connectors;

forming reflowable layers on an interposer;

contacting each of the first reflowable connectors and the second reflowable connectors to corresponding ones of the reflowable layers; and reflowing the first reflowable connectors, the second reflowable connectors, and the reflowable layers to bond the package substrate to the interposer.

2. The method of claim 1, wherein the first region is a center of the package substrate in a top-down view, and the second region is an edge/corner of the package substrate in the top-down view.

3. The method of claim 1, wherein the first region is an edge/corner of the package substrate in a top-down view, and the second region is a center of the package substrate in the top-down view.

4. The method of claim 1, wherein the first reflowable connectors are contacted to a first subset of the reflowable layers, the second reflowable connectors are contacted to a second subset of the reflowable layers, and forming the reflowable layers comprises:

printing the first subset of the reflowable layers to a first thickness; and printing the second subset of the reflowable layers to a second thickness, the second thickness greater than the first thickness.

5. The method of claim 1, wherein the first reflowable connectors are formed on a first subset of bond pads of the package substrate, the second reflowable connectors are formed on a second subset of the bond pads of the package substrate, the second reflowable connectors have a greater volume than the first reflowable connectors, and the first subset of the bond pads have the same width as the second subset of the bond pads.

6. The method of claim 1, wherein the first reflowable connectors are formed on a first subset of bond pads of the package substrate, the second reflowable connectors are formed on a second subset of the bond pads of the package substrate, the second reflowable connectors have the same volume as the first reflowable connectors, and the first subset of the bond pads have a greater width than the second subset of the bond pads.

7. The method of claim 1, wherein the first reflowable connectors are formed on a first subset of bond pads of the package substrate, the second reflowable connectors are formed on a second subset of the bond pads of the package substrate, the second reflowable connectors have a greater volume than the first reflowable connectors, and the first subset of the bond pads have a greater width than the second subset of the bond pads.

8. A method comprising:

forming first reflowable connectors on a first subset of bond pads of a package substrate, the first reflowable connectors disposed in a center of the package substrate in a top-down view;

forming second reflowable connectors on a second subset of the bond pads of the package substrate, the second reflowable connectors disposed in an edge/corner of the package substrate in the top-down view, the second reflowable connectors having a greater height than the first reflowable connectors;

after forming the first reflowable connectors and the second reflowable connectors, placing the package substrate on an interposer;

reflowing the first reflowable connectors and the second reflowable connectors to bond the package substrate to the interposer; and singulating the interposer after reflowing the first reflowable connectors and the second reflowable connectors.

9. The method of claim 8, wherein the second reflowable connectors have a greater volume than the first reflowable connectors, and the first subset of the bond pads have the same width as the second subset of the bond pads.

10. The method of claim 8, wherein the second reflowable connectors have the same volume as the first reflowable connectors, and the first subset of the bond pads have a greater width than the second subset of the bond pads.

11. The method of claim 8, wherein the second reflowable connectors have a greater volume than the first reflowable connectors, and the first subset of the bond pads have a greater width than the second subset of the bond pads.

12. The method of claim 8, wherein the interposer comprises reflowable layers, a first subset of the reflowable layers are in contact with the first reflowable connectors, a second subset of the reflowable layers are in contact with the second reflowable connectors, the first reflowable connectors and the first subset of the reflowable layers are reflowed to form first conductive connectors, the second reflowable connectors and the second subset of the reflowable layers are reflowed to form second conductive connectors, and a second height of the second conductive connectors is greater than a first height of the first conductive connectors.

13. The method of claim 8, wherein the interposer comprises reflowable layers, a first subset of the reflowable layers are in contact with the first reflowable connectors, a second subset of the reflowable layers are in contact with the second reflowable connectors, and the second subset of the reflowable layers are thicker than the first subset of the reflowable layers.

14. The method of claim 8, wherein the interposer comprises reflowable layers, a first subset of the reflowable layers are in contact with the first reflowable connectors, a second subset of the reflowable layers are in contact with the second reflowable connectors, and the second subset of the reflowable layers are wider than the first subset of the reflowable layers.

15. A method comprising:

forming reflowable connectors on bond pads of a package substrate, wherein forming the reflowable connectors comprises:

forming a first subset of the reflowable connectors in a first process, the first subset of the reflowable connectors being formed on a first subset of the bond pads, the first subset of the bond pads being in a center of the package substrate;

forming a second subset of the reflowable connectors in a second process, the second process being distinct from the first process, the second subset of the reflowable connectors being formed on a second subset of the bond pads, the second subset of the bond pads being in an edge/corner of the package substrate, the first subset of the bond pads having a greater width than the second subset of the bond pads; and reflowing the first subset and the second subset of the reflowable connectors with a single reflow, the second subset of the reflowable connectors having a greater height than the first subset of the reflowable connectors, the second subset of the reflowable connectors having a greater volume than the first subset of the reflowable connectors;

placing the package substrate on an interposer; and reflowing the reflowable connectors to bond the package substrate to the interposer.

16. The method of claim 15, further comprising: singulating the interposer after reflowing the reflowable connectors.

17. The method of claim 15, wherein the interposer comprises reflowable layers, and wherein placing the package substrate comprises contacting the reflowable connectors to the reflowable layers without gaps between the reflowable connectors and the reflowable layers.

18. The method of claim 15, wherein the interposer comprises reflowable layers, wherein a first subset of the reflowable layers contact the first subset of the reflowable connectors, a second subset of the reflowable layers contact the second subset of the reflowable connectors, and the second subset of the reflowable layers are thicker than the first subset of the reflowable layers.

19. The method of claim 15, wherein the interposer comprises reflowable layers, wherein a first subset of the reflowable layers contact the first subset of the reflowable connectors, a second subset of the reflowable layers contact the second subset of the reflowable connectors, and the second subset of the reflowable layers are wider than the first subset of the reflowable layers.

20. The method of claim 15, wherein reflowing the reflowable connectors to bond the package substrate to the interposer forms first conductive connectors from the first subset of the reflowable connectors and second conductive connectors from the second subset of the reflowable connectors, and a height of the second conductive connectors is less than twice a height of the first conductive connectors.

* * * * *